US008723278B2

(12) United States Patent
Lai et al.

(10) Patent No.: US 8,723,278 B2
(45) Date of Patent: May 13, 2014

(54) SENSOR ELEMENT ARRAY AND METHOD OF FABRICATING THE SAME

(75) Inventors: Chih-Ming Lai, Changhua County (TW); Yung-Hui Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 144 days.

(21) Appl. No.: 13/411,623

(22) Filed: Mar. 4, 2012

(65) Prior Publication Data

US 2013/0161703 A1 Jun. 27, 2013

(30) Foreign Application Priority Data

Dec. 22, 2011 (TW) .............................. 100147969 A

(51) Int. Cl.
H01L 29/84 (2006.01)
G02F 1/1333 (2006.01)

(52) U.S. Cl.
CPC .................................. *G02F 1/13338* (2013.01)
USPC ............... 257/415; 257/52; 257/59; 257/290; 257/350; 438/66; 345/173

(58) Field of Classification Search
CPC ........................ G02F 1/13338; H01L 27/1462
USPC ............. 257/52, 59, 254, 350, 290; 324/661; 438/66
See application file for complete search history.

(56) References Cited

U.S. PATENT DOCUMENTS

| | | | |
|---|---|---|---|
| 5,132,541 A * | 7/1992 | Conrads et al. .......... 250/370.01 |
| 7,046,240 B2 * | 5/2006 | Kimura ......................... 345/212 |
| 7,202,179 B2 | 4/2007 | Taussig et al. | |
| 7,248,306 B2 | 7/2007 | Perner et al. | |
| 7,341,839 B2 | 3/2008 | Hollyfield et al. | |
| 7,409,876 B2 | 8/2008 | Ganapathi et al. | |
| 7,521,313 B2 | 4/2009 | Mei | |
| 7,541,227 B2 | 6/2009 | Mei et al. | |
| 7,585,424 B2 | 9/2009 | Mei | |
| 7,932,135 B1 * | 4/2011 | Nam et al. .................... 438/149 |
| 7,995,062 B2 | 8/2011 | Zhang | |
| 8,063,856 B2 * | 11/2011 | Sarma et al. .................... 345/76 |

(Continued)

OTHER PUBLICATIONS

Graz et al, "Flexible active-matrix cells with selectively poled bifunctional polymerceramic nanocomposite for pressure and temperature sensing skin," Journal of Applied Physics 106, 2009, pp. 034503-1-034503-5.

(Continued)

*Primary Examiner* — William F Kraig
*Assistant Examiner* — Pavel Ivanov
(74) *Attorney, Agent, or Firm* — Jianq Chyun IP Office

(57) ABSTRACT

A sensor element array and method of fabricating the same are provided. The sensor element array is disposed on a substrate and includes a first patterned conductive layer, a channel layer, a first insulation layer, a second patterned conductive layer, a second insulation layer, and a third patterned conductive layer. The first patterned conductive layer includes a sensing line, a first power line, a source/drain pattern and a branch pattern. The channel layer includes a first channel and a second channel. Margins of the first insulation layer and the second patterned conductive layer are substantially overlapped. The second patterned conductive layer includes a selecting line, a gate pattern, and a gate connecting pattern. The second insulation layer has a first connecting opening for exposing the gate connecting pattern. The third patterned conductive layer includes a sensing electrode electrically connected to the gate connecting pattern.

28 Claims, 23 Drawing Sheets

(56) References Cited

U.S. PATENT DOCUMENTS

| | | | |
|---|---|---|---|
| 8,110,887 B2* | 2/2012 | Brown et al. | 257/458 |
| 2004/0051155 A1* | 3/2004 | Oka | 257/414 |
| 2004/0106238 A1* | 6/2004 | Lai | 438/151 |
| 2005/0285822 A1* | 12/2005 | Reddy et al. | 345/76 |
| 2006/0017875 A1 | 1/2006 | Perner et al. | |
| 2006/0134922 A1 | 6/2006 | Taussig et al. | |
| 2006/0262100 A1* | 11/2006 | Van Berkel | 345/173 |
| 2007/0040491 A1 | 2/2007 | Mei et al. | |
| 2007/0058099 A1* | 3/2007 | Eguchi | 349/43 |
| 2007/0117278 A1 | 5/2007 | Perlov et al. | |
| 2008/0185591 A1 | 8/2008 | Mei et al. | |
| 2008/0207077 A1 | 8/2008 | Haase | |
| 2008/0303037 A1 | 12/2008 | Irving et al. | |
| 2010/0225609 A1* | 9/2010 | Huang et al. | 345/173 |
| 2011/0102359 A1* | 5/2011 | Chiba et al. | 345/173 |

OTHER PUBLICATIONS

Taussig et al., "77.3: Invited Paper: Roll-to-Roll Manufacturing of Backplanes for Paper-Like Displays," SID 2010 Digest, 2010, pp. 1151-1154.

Shirinov et al., "Pressure sensor from a PVDF film," Sensors and Actuators A 142, 2008, pp. 48-55.

Graz et al, "Flexible ferroelectret field-effect transistor for large-area sensor skins and microphones," Applied Physics Letters 89, 2006, pp. 073501-1-073501-3.

Mannsfeld et al, "Highly sensitive flexible pressure sensors with microstructured rubber dielectric layers," Nature Materials 9, Sep. 2010, pp. 859-864.

* cited by examiner

SENSOR ELEMENT ARRAY AND METHOD OF FABRICATING THE SAME

CROSS-REFERENCE TO RELATED APPLICATION

This application claims the priority benefit of Taiwan application serial no. 100147969, filed on Dec. 22, 2011. The entirety of the above-mentioned patent application is hereby incorporated by reference herein and made a part of this specification.

TECHNICAL FIELD

The disclosure relates to a sensor element array, and more particularly to a sensor element array fabricated by using a roll-to-roll process.

BACKGROUND

Since the flexible electronic device has several superior characteristics such as lightness, flexibility, endurance from high impact, safety, and portability, the flexible electronic device is becoming the mainstream device for the next generation. Generally speaking, the method of fabricating the electronic device over a flexible substrate requires attaching the flexible substrate over a rigid substrate by first employing an adhesion layer. Next, the electronic device is fabricated on the flexible substrate, where the flexible substrate is attached on the rigid substrate directly. Finally, after electronic devices are fabricated on the flexible substrate it is then separated from the rigid substrate.

However, the flexible substrate usually has a higher thermal expansion coefficient (CTE), so the flexible substrate inflates or shrinks according to the change of the environmental temperature during the process of fabricating the flexible electronic device. Especially, when CTE mismatch between the rigid substrate and the flexible substrate occurs it may further cause stress on the fabricated electronic device. Therefore, in order to fabricate electronic device such as the thin film transistor over the flexible substrate, it is necessary to overcome problems such as poor alignment accuracy and the processing temperature limitations.

SUMMARY

The disclosure provides a fabricating method of a sensor element array which applies the roll-to-roll process for fabricating the low cost and large area sensor element array.

The disclosure provides a sensor element array consisting of active sensor elements capable of sensing the change of the loading stress thereon.

The disclosure provides a fabricating method of the sensor element array. A first patterned conductive layer formed over a substrate includes a sensing line, a first power line, a source/drain pattern and a branch pattern. The sensing line, the first power line and the source/drain pattern are separated individually, and the branch pattern is connected to the first power line. The source/drain pattern includes a first section next to the sensing line and a second section next to the branch pattern. A channel layer formed on the first patterned conductive layer includes a first channel and a second channel, where the first channel connects the first section with the sensing line and the second channel connects the second section with the branch pattern. An insulating material layer and a conductive material layer are sequentially formed over the substrate and patterned to form a first insulation layer and a second patterned conductive layer, respectively. Margins of the first insulation layer and the second patterned conductive layer are substantially overlapped. The second patterned conductive layer includes a selecting line, a gate pattern and a gate connecting pattern. The selecting line disposed over the first channel traverses the sensing line and the first section of the source/drain pattern. The gate pattern is disposed over the second channel, and the gate connecting pattern is connected to the gate pattern. A second insulation layer is formed over the second patterned conductive layer with a first connecting opening for exposing the gate connecting pattern. A third patterned conductive layer formed over the second insulation layer includes a sensing electrode electrically connected to the gate connecting pattern.

The disclosure further provides a sensor element array disposed on a substrate. The sensor element array includes a first patterned conductive layer, a channel layer, a first insulation layer, a second patterned conductive layer, a second insulation layer and a third patterned conductive layer. The first patterned conductive layer includes a sensing line, a first power line, a source/drain pattern and a branch pattern. The sensing line, the first power line and the source/drain pattern are separated individually. In addition, the branch pattern is connected to the first power line and the source/drain pattern includes a first section next to the sensing line and a second section next to the branch pattern. A channel layer includes a first channel and a second channel, where the first channel connects the first section with the sensing line and the second channel connects the second section with the branch pattern. Margins of the first insulation layer and the second patterned conductive layer are substantially overlapped. The second patterned conductive layer includes a selecting line, a gate pattern and a gate connecting pattern. The selecting line disposed over the first channel traverses the sensing line and the first section of the source/drain pattern. The gate pattern is disposed over the second channel and the gate connecting pattern is connected to the gate pattern. The second insulation layer has a first connecting opening for exposing the gate connecting pattern. The third patterned conductive layer includes a sensing electrode electrically connected to the gate connecting pattern.

In order to make the aforementioned and other features and advantages of the present disclosure more comprehensible, several embodiments accompanied with figures are described in detail below.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

FIG. 1A through FIG. 6A are top views illustrating the flow of fabricating the sensor element array in the first embodiment of the disclosure.

FIG. 1B through FIG. 6B are schematic cross-sectional views taken along a line I-I' of FIG. 1A through FIG. 6A.

FIG. 8A through FIG. 13A are top views illustrating the flow of fabricating the sensor element array in the second embodiment of the disclosure.

FIG. 8B through FIG. 13B are schematic cross-sectional views taken along a line II-II' of FIG. 8A through FIG. 13A.

FIG. 15A through FIG. 20A are top views illustrating the flow of fabricating the sensor element array in the third embodiment of the disclosure.

FIG. 15B through FIG. 20B are schematic cross-sectional views taken along a line of FIG. 15A through FIG. 20A.

DETAILED DESCRIPTION OF DISCLOSED EMBODIMENTS

Figure 1A:
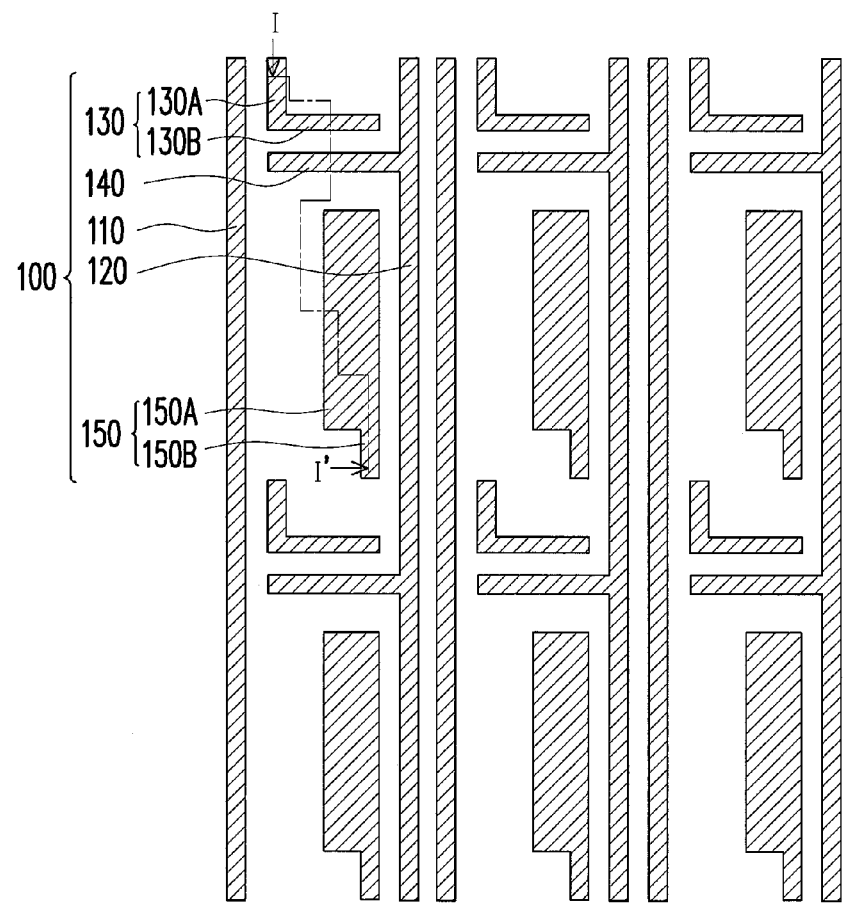
Figure 1B:
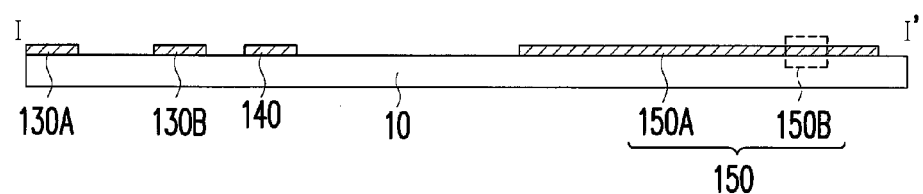

FIG. 1A, 2A through FIG. 6A are top views illustrating the process flow of fabricating the sensor element array in the first embodiment of the disclosure, and FIG. 1B, 2B through FIG. 6B are schematic cross-sectional views taken along a line I-I' of FIG. 1A, 2A through FIG. 6A. As shown in FIG. 1A and FIG. 1B, a fabricating method of the embodiment includes forming a first patterned conductive layer 100 over a substrate 10. The first patterned conductive layer 100 includes a sensing line 110, a first power line 120, a source/drain pattern 130, a branch pattern 140 and a sensing electrode connecting pattern 150. The sensing line 110, the first power line 120, the source/drain pattern 130 and the sensing electrode connecting pattern 150 are separated individually, and the branch pattern 140 is connected to the first power line 120. In addition, the source/drain pattern 130 includes a first section 130A next to the sensing line 110 and a second section 130B next to the branch pattern 140. The sensing electrode connecting pattern 150 includes a connecting section 150A and a first extending section 150B, where the first extending section 150B connected to the connecting section 150A is near to the first power line 120.

In specific, the substrate 10 may be a flexible substrate for fabricating the first patterned conductive layer 100 on top by utilizing the roll-to-roll process, wherein the substrate 10 can be made of the flexible material, such as plastic, metal, stainless steel, the stainless steel coated with a plastic thin film or etc. As a result, the fabricating process of the first patterned conductive layer 100, i.e. the roll-to-roll process, does not involve a high temperature so as to avoid the distortion or damage of the substrate 10 caused by high temperature. In addition, the roll-to-roll process is preferably applied because of the features such as low manufacturing cost and large fabricating area.

However, the disclosure is not limited as such. In other embodiments, the substrate 10 may be a rigid substrate, so the process for fabricating the first patterned conductive layer may be the conventional film forming process, such as chemical deposition process or physical deposition process. In addition, when the substrate 10 is a flexible substrate, the flexible substrate may be attached on another rigid substrate temporarily for applying the conventional film forming process (such as chemical deposition process or physical deposition process) in order to fabricate the first patterned conductive layer 100. Alternatively, the method of fabricating the first patterned conductive layer 100 over the substrate 10 can be a sheet-to-sheet process. It should be noted that the other elements in the embodiment can be fabricated by any one or more of the above-mentioned processes but not limited to the roll-to-roll process.

The material of the first patterned conductive layer 100 can be titanium, aluminum, molybdenum, chromium, molybdenum-tungsten alloy, indium tin oxide (ITO) or a combination thereof. In an embodiment, the first patterned conductive layer 100 may be a single material layer or a plurality of single material layers stacked together. For example, the first patterned conductive layer 100 may be constituted by the layers stacked together, such as Ti/Al, Ti/Mo, Ti/Al/Ti, Ti/Al/Mo, Mo/Al/Mo or Al/TIO.

Figure 2A:
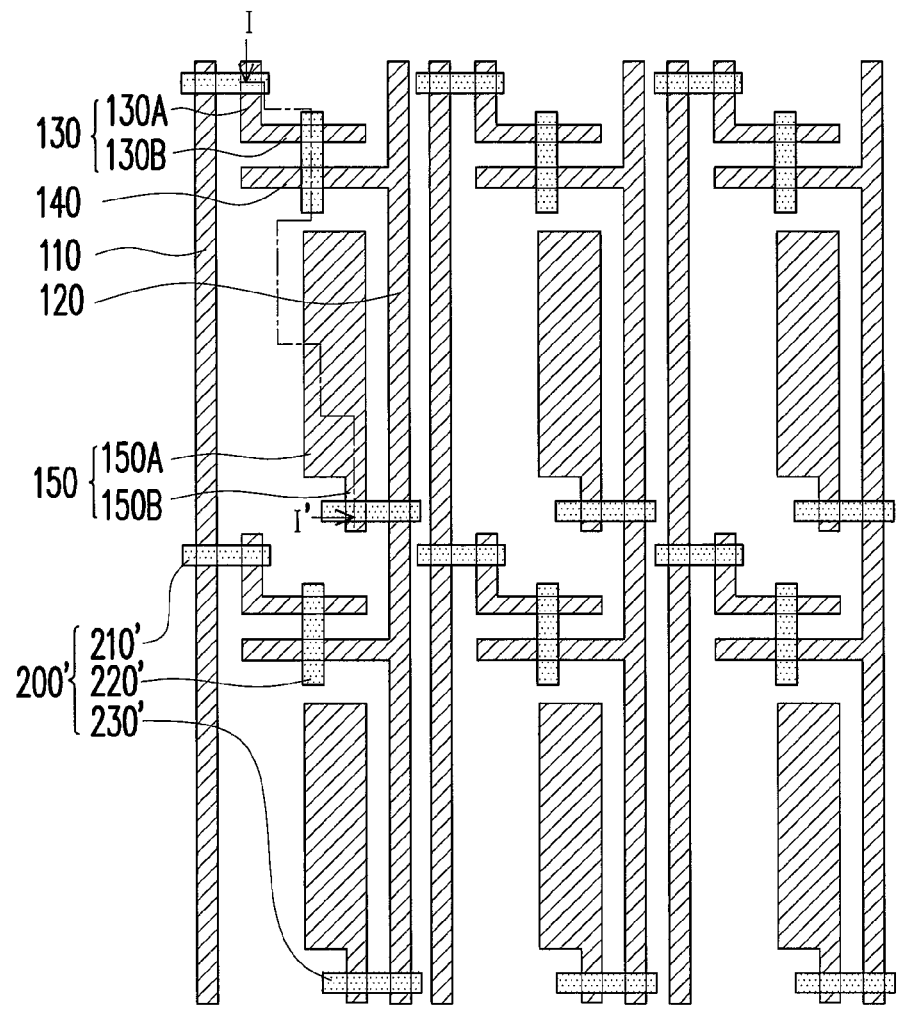
Figure 2B:
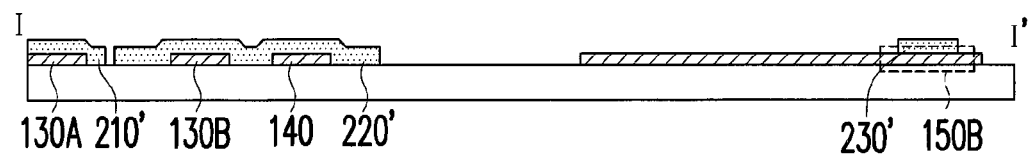

Referring next to FIG. 2A and FIG. 2B, a pre-patterned channel layer 200', which including a first pre-patterned channel 210', a second pre-patterned channel 220' and a third pre-patterned channel 230', is formed over the first patterned conductive layer 100. The first pre-patterned channel 210' connects the first section 130A of the source/drain pattern 130 with the sensing line 110, the second pre-patterned channel 220' connects the second section 130B of the source/drain pattern 130 with the branch pattern 140, and the third pre-patterned channel 230' connects the first extending section 150B of the sensing electrode connecting pattern 150 with the first power line 120.

The material of the pre-patterned channel layer 200' may be the zinc oxide (ZnO), indium-gallium-zinc oxide (IGZO), indium-aluminum-zinc oxide, indium-hafnium-zinc oxide or indium-zinc-tin oxide. More specifically, the pre-patterned channel layer 200' selectively includes a dopant selected from the group consisting of indium, aluminum, gallium, tin, hafnium and a combination thereof. In other words, the pre-patterned channel layer 200' can be a metal oxide semiconductor thin film consisting of the dopant, such as indium, aluminum, gallium, tin, hafnium or a combination of above-mentioned metal. Furthermore, the method of fabricating the pre-patterned channel layer 200' employs the roll-to-roll process or other film process.

Figure 3A:
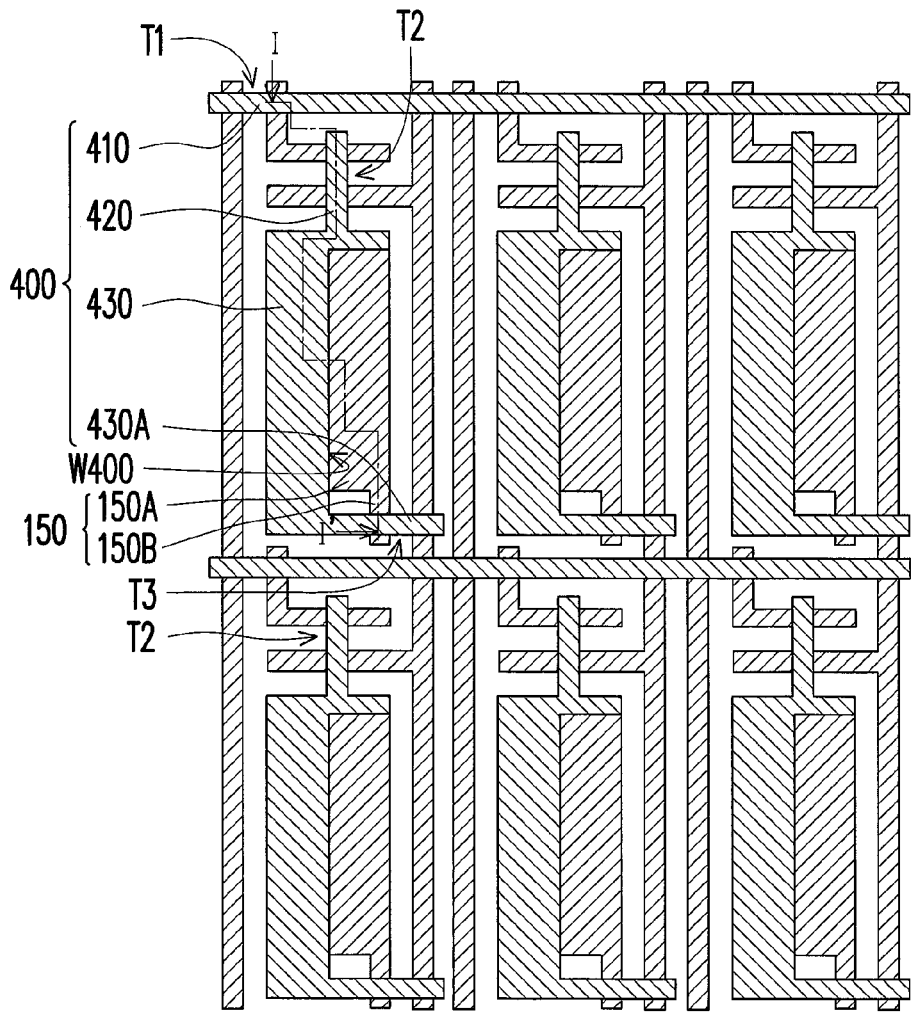
Figure 3B:
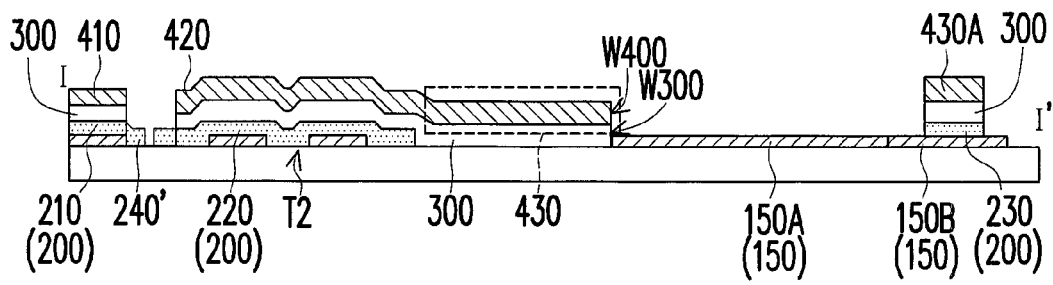

Referring to the FIG. 3A and FIG. 3B, an insulating material layer and a conductive material layer are sequentially formed over the substrate 10 and patterned to form a first insulation layer 300 and a second patterned conductive layer 400. The material and the stacked structure of the second patterned conductive layer 400 can be chosen as same as the first patterned conductive layer 100. A layer of an insulating material, such as $Si_3N_4$, $SiO_2$, $Al_2O_3$, $Ta_2O_5$, $HfO_2$, $TiO_2$ or either the two-layered or three-layered stack made from the combination of the aforesaid material, can be used for forming the first insulation layer 300. Of course, the method of fabricating the first insulation layer 300 and the second patterned conductive layer 400 can also be the roll-to-roll process or other film forming processes.

In this step, patterning the insulating material layer and the conductive material layer includes first patterning the conductive material layer to form the second patterned conductive layer 400. Next, the second patterned conductive layer 400 is employed as a mask for patterning the insulating material layer to form the first insulation layer 300. At this moment, margins of the first insulation layer 300 and the second patterned conductive layer 400 are substantially overlapped. In other words, according to the fabricating method in the present embodiment, the second patterned conductive layer 400 and the first insulation layer 300 are self-aligned so that the above two layers have the same pattern viewed from the top.

In addition, the pre-patterned channel layer 200' in the FIG. 2A and FIG. 2B and the second patterned conductive layer 400 are patterned by applying different masks (photo mask). Hence, as the dotted line part shown in the FIG. 3B, an exposed part 240' of the pre-patterned channel layer 200' may exist. As a result, this step further removes the exposed part 240' by applying the second patterned conductive layer 400 as a mask in order to form the channel layer 200. In the present step, the first pre-patterned channel 210', the second pre-patterned channel 220' and the third pre-patterned channel 230' in the FIG. 2A and FIG. 2B are patterned individually to be the first channel 210, the second channel 220 and the third channel 230 illustrated in the FIG. 3A and FIG. 3B. Accordingly, margins of the channel layer 200 and the second patterned conductive layer 400 are partially overlapped, thereby achieving the self-aligned design.

As shown in an embodiment, the second patterned conductive layer 400 includes a selecting line 410, a gate pattern 420 and a gate connecting pattern 430. The selecting line 410 disposed over the first channel 210 traverses between the sensing line 110 and the first section 130A of the source/drain pattern 130 in order to constitute a first transistor T1. The gate pattern 420 disposed over the second channel 220 traverses between the second section 130B of the source/drain pattern 130 and the branch pattern 140 in order to constitute a second transistor T2. The gate connecting pattern 430 including a second extending section 430A is connected to the gate pattern 420. The second extending section 430A disposed over the third channel 230 traverses between the first extending section 150B of the sensing electrode connecting pattern 150 and the first power line 120 in order to constitute a third transistor T3.

As a result, the sections of the first patterned conductive layer 100 which are in contact with the first channel 210, the second channel 220 or the third channel 230 can be regarded as the source/drain of the first transistor T1, the second transistor T2, or the third transistor T3. One of the source/drain of the first transistor T1 and one of the source/drain of the second transistor T2 are composed by the integral source/drain pattern 130 so that the first transistor T1 and the second transistor T2 are connected together. In addition, the gate of the second transistor T2 is composed by the gate pattern 420 and the gate of the third transistor T3 is composed by the second extending section 430A of the gate connecting pattern 430, so that the gates of the second transistor T2 and the third transistor T3 are connected together.

Furthermore, by controlling the patterning process, the connecting section 150A of the sensing electrode connecting pattern 150 is exposed by the second patterned conductive layer 400 and the first insulation layer 300. Moreover, the gate connecting pattern 430 is near to the exposed connecting section 150A of the sensing electrode connecting pattern 150. That is, an opening W300 of the first insulation layer 300 and another opening W400 of the second patterned conductive layer 400 are overlapped and expose the connecting section 150A of the sensing electrode connecting pattern 150 at the same time. Especially, referring to the top view of FIG. 3A, the connecting section 150A of the sensing electrode connecting pattern 150 and the gate connecting pattern 430 compose two elements arranged side by side on the substrate 10.

Figure 4A:
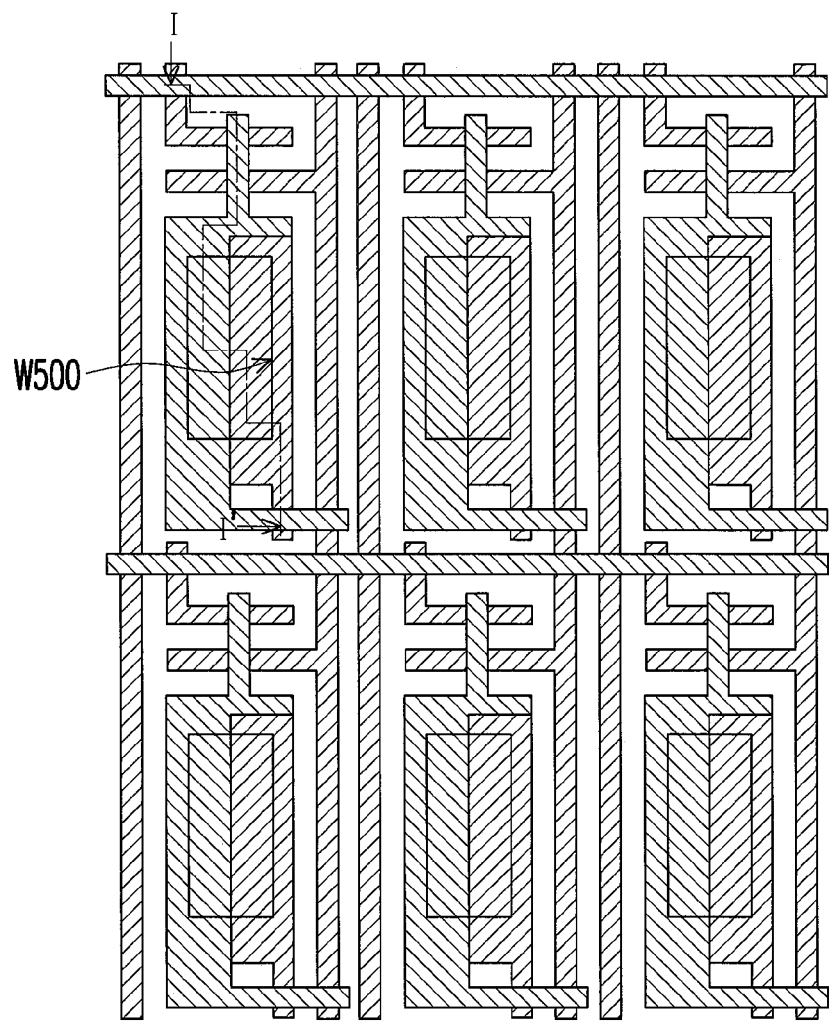
Figure 4B:
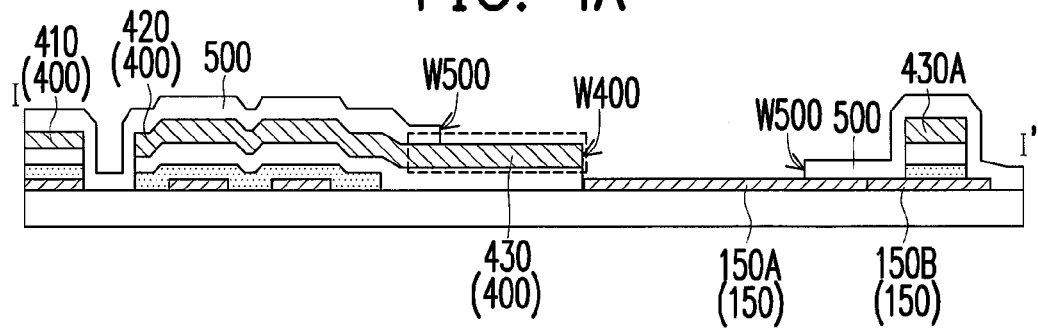

Thereafter, referring to the FIG. 4A and FIG. 4B, a second insulation layer 500 having a connecting opening W500 is formed over the second patterned conductive layer 400. The material and the fabricating process of the second insulation layer 500 is much like those of the first insulation layer 300. In this embodiment, the connecting opening W500 exposes both the gate connecting pattern 430 and the connecting section 150A of the sensing electrode connecting pattern 150.

Figure 5A:
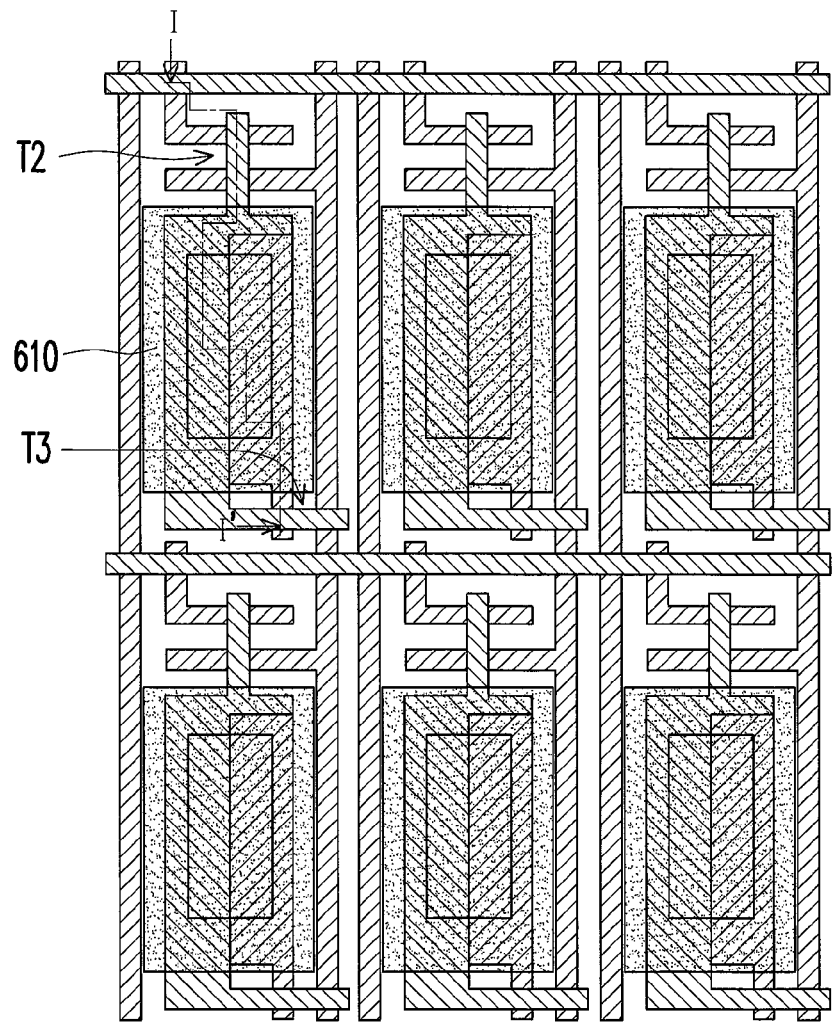
Figure 5B:
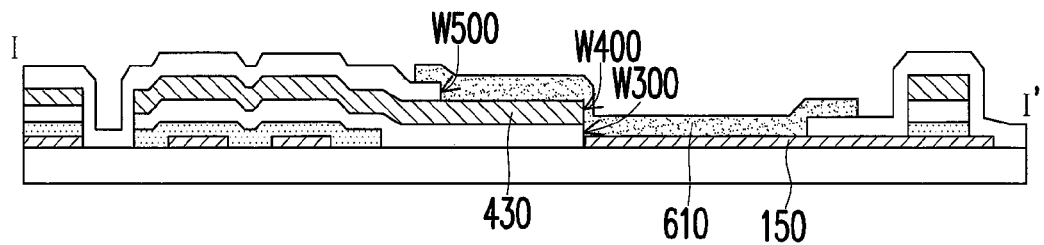

Afterwards, referring to the FIG. 5A and FIG. 5B, a third patterned conductive layer for composing the sensing electrode 610 is formed over the second insulation layer 500. Because of the connecting opening W500 and the design of the openings W400 and W300, the sensing electrode 610 is connected to the gate connecting pattern 430 and the connecting section 150A of the sensing electrode connecting pattern 150 simultaneously. As a result, the gates of the second transistor T2 and the third transistor T3 can be connected to the source/drain of the third transistor T3 through the sensing electrode 610.

Figure 6A:
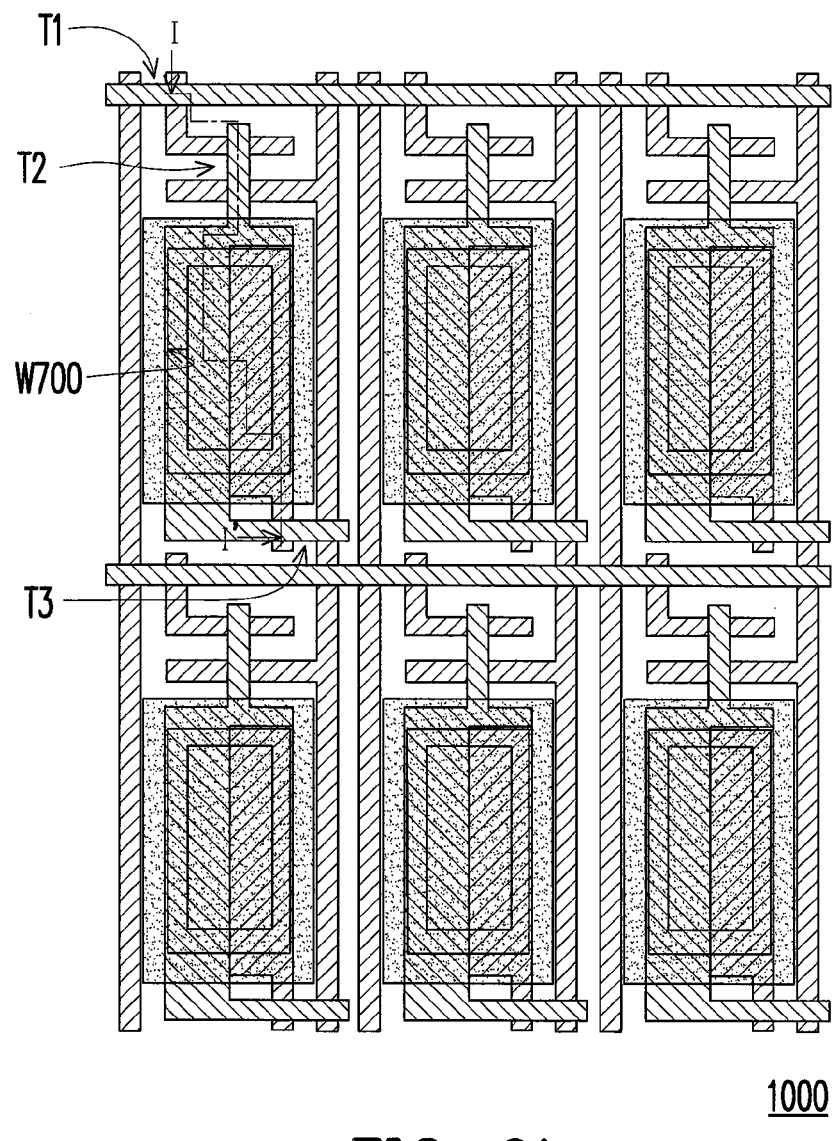
Figure 6B:
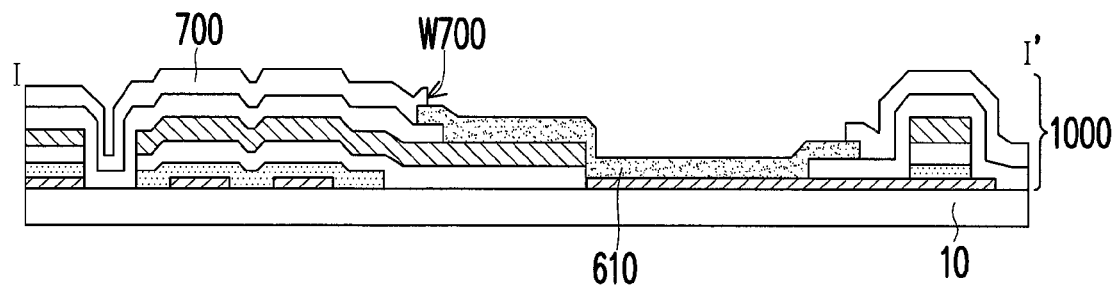

Furthermore, referring to the FIG. 6A and FIG. 6B, in order to protect the first transistor T1, the second transistor T2 and the third transistor T3, a third insulation layer 700 is formed for covering the first transistor T1, the second transistor T2 and the third transistor T3 over the substrate 10 in the present embodiment. Also, an opening W700 is disposed on the third insulation layer 700 for exposing the electrode 610 in order to compose the sensor element array 1000. In the present embodiment, the material and the fabricating method of the third insulation layer 700 can be much like the first insulation layer 300, or the material can be an organic insulating film material suitable for a coating process, such as polyvinyl pyrrolidone (PVP), polyvinyl alcohol (PVA), polyacrylates, Cinnamate-based polyvinylphenols (Ci-PVP) or parylenes, photoacryl (PC403 of JSR Co.).

A detecting circuit of an active array sensing element can be accomplished because of the coupling of the first transistor T1, the second transistor T2 and the third transistor T3. The first transistor T1 is served as a switch transistor, and the second transistor T2, the third transistor T3 and the sensing elements are composed to form a current mirror circuit structure. However, the disclosure is not limited by the embodiment. Moreover, the second transistor T2 and the third transistor T3 are connected through the sensing electrode 610 without additional connecting element. Since the additional connecting components are not necessarily configured in the design, the sensing electrode 610 responsible for both sensing and connecting can have larger disposed area, which enlarges the sensing area of the sensing element. In other words, the sensor element array 1000 has higher sensing aperture ratio.

Figure 7:
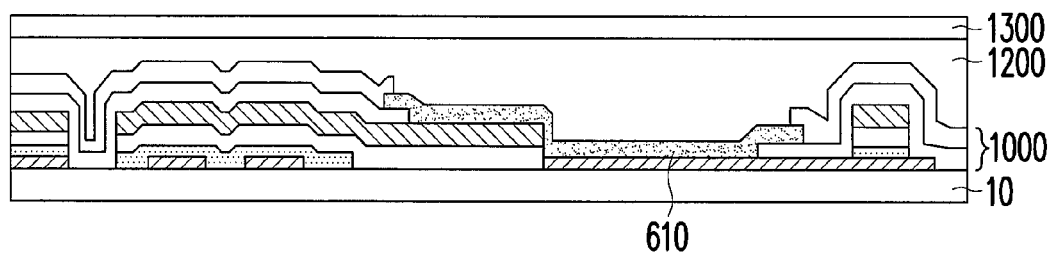
FIG. 7 is a cross-sectional view of a sensing panel according to the first embodiment of the disclosure.

FIG. 7 is a cross-sectional view of a sensing panel according to the first embodiment of the disclosure. Referring to the FIG. 7, the sensing panel 1 includes the sensor element array 1000 formed on the substrate 10, a sensing dielectric layer 1200 and an opposite electrode 1300, wherein the opposite electrode 1300 and the sensing electrode 610 of the sensor element array 1000 are disposed respectively at the opposite sides of the sensing dielectric layer 1200. Herein, the sensor element array 1000, for example, is fabricated by following the steps illustrated in FIG. 1A-FIG. 6A and FIG. 1B-FIG. 6B. Hence, the elements of the sensor element array 1000 can be referred to the previous paragraphs. Moreover, the material of the sensing dielectric layer 1200, for example, can be the material which has the electrical property changed according to the loading stress such as carbon paste. Therefore, when a user presses the sensing panel 1, the changed electrical property of the sensing dielectric layer 1200 can be detected by the sensor element array 1000 in order to accomplish the sensing of the stress. At this moment, the sensing panel 1 can be a resistive sensing panel, for example.

Figure 8A:
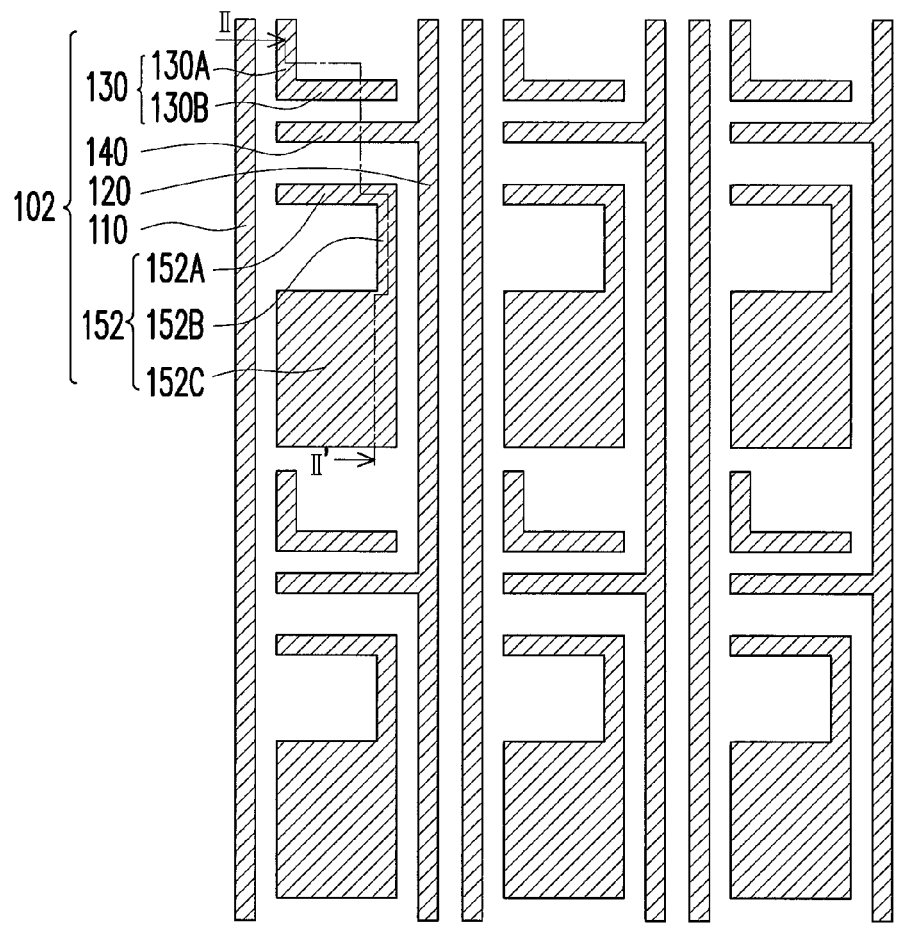
Figure 8B:
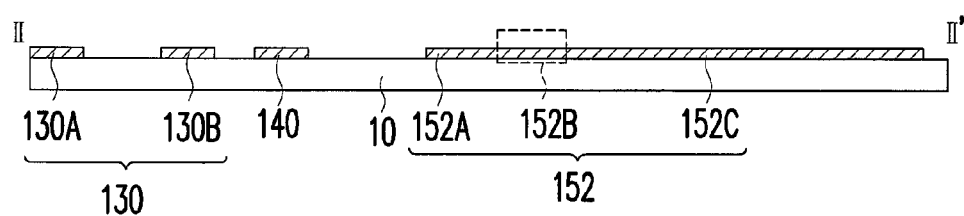

FIG. 8A, 9A through FIG. 13A are top views illustrating the flow of fabricating the sensor element array in the second embodiment of the disclosure, and FIG. 8B, 9B through FIG. 13B are schematic cross-sectional views taken along a line II-II' of FIG. 8A, 9A through FIG. 13A. As shown in FIG. 8A and FIG. 8B, a fabricating method of the embodiment is to form a first patterned conductive layer 102 over a substrate 10. The first patterned conductive layer 102 includes a sensing line 110, a first power line 120, a source/drain pattern 130, a branch pattern 140 and a sensing electrode connecting pattern 152. In the present embodiment, the allocation of the sensing line 110, the first power line 120, the source/drain pattern 130 and the branch pattern 140 is much like the allocation thereof in the first embodiment, so no detailed description is repeated. In addition, the material and the fabricating method of the substrate 10 and the first patterned conductive layer 102 can be referred to the previous embodiment as well.

To be more specific, the main difference between the first patterned conductive layer 102 in the present embodiment and the first patterned conductive layer 100 in the previous embodiment is that the sensing electrode connecting pattern 152 of the first patterned conductive layer 102 includes a connecting section 152A, a first extending section 152B and a sensing section 152C. The first extending section 152B near to the first power line 120 connects the sensing section 152C with the connecting section 152A.

Figure 9A:
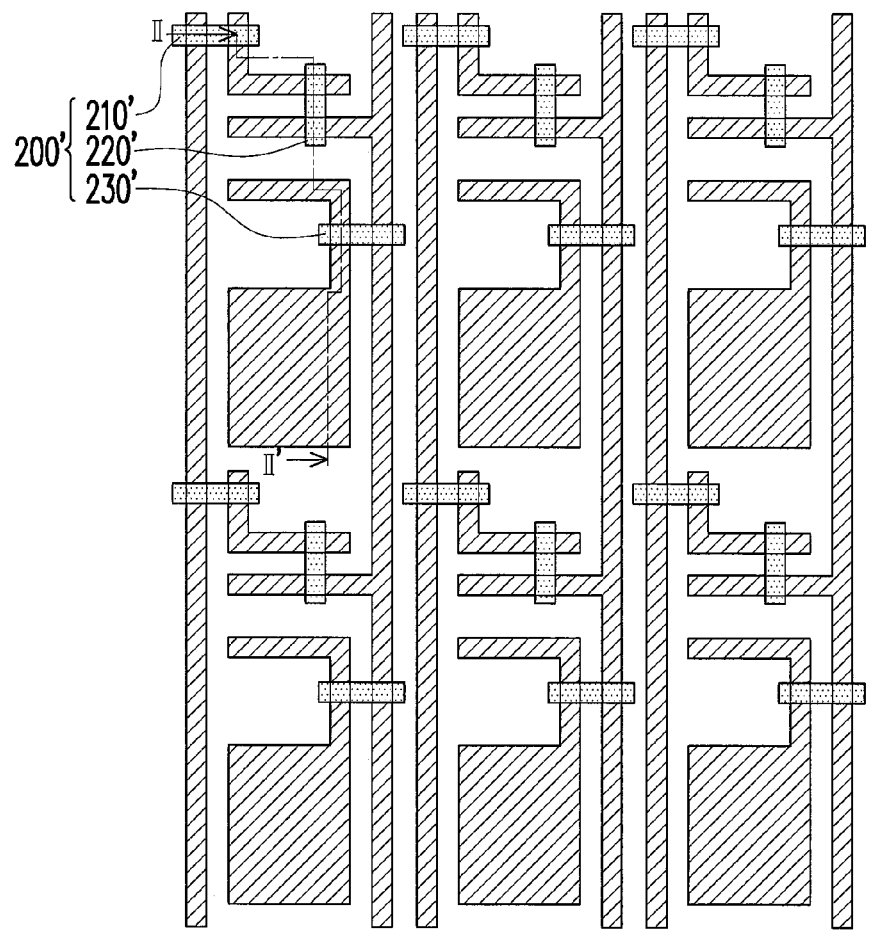
Figure 9B:
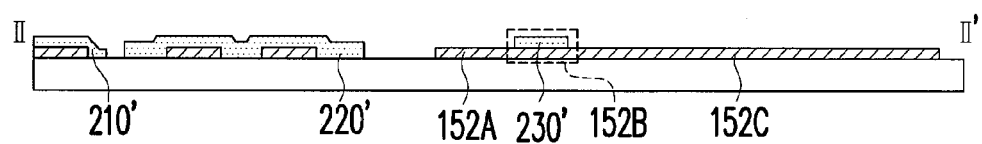

Referring next to FIG. 9A and FIG. 9B, a pre-patterned channel layer 200', including a first pre-patterned channel 210', a second pre-patterned channel 220' and a third pre-patterned channel 230', is formed on the first patterned conductive layer 100. The pre-patterned channel layer 200' in the present embodiment is substantially alike the pre-patterned channel layer 200' in the previous embodiment, hence the material, the allocation, and the fabricating method of the pre-patterned channel layer 200' are not described here again.

Figure 10A:
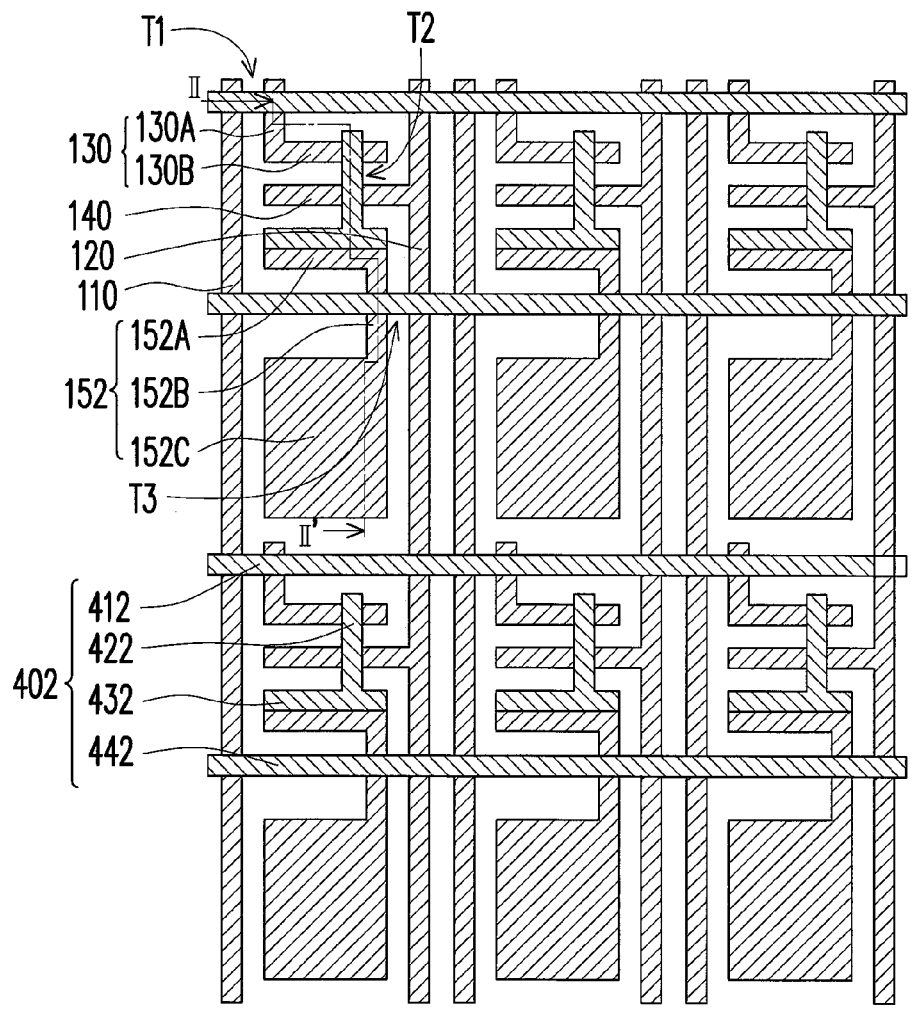
Figure 10B:
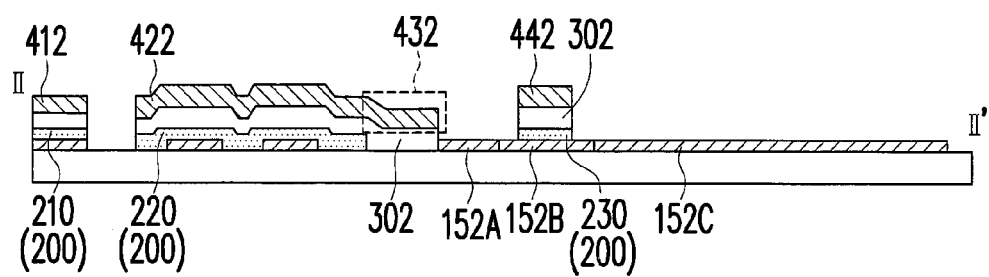

Next, referring to the FIG. 10A and FIG. 10B, an insulating material layer and a conductive material layer are sequentially formed over the substrate 10 and patterned to form a first insulation layer 302 and a second patterned conductive layer 402. Similar to the first embodiment, the method for patterning the insulating material layer and the conductive material layer includes patterning the conductive material layer to first form the second patterned conductive layer 402, and second using the second patterned conductive layer 402 as a mask for patterning the first insulation layer 302. At this moment, margins of the first insulation layer 302 and the second patterned conductive layer 402 are substantially overlapped.

Similar to the first embodiment, this step further removes the exposed part of the pre-patterned channel layer 200' by applying the second patterned conductive layer 402 as a mask in order to form the channel layer 200. Herein, the first pre-patterned channel 210', the second pre-patterned channel 220' and the third pre-patterned channel 230' illustrated in FIG. 9A and FIG. 9B are patterned respectively to be the first channel 210, the second channel 220 and the third channel 230.

In the present embodiment, the second patterned conductive layer 402 includes a selecting line 412, a gate pattern 422, a gate connecting pattern 432 and a second power line 442. The selecting line 412 disposed over the first channel 210 traverses the sensing line 110 and first section 130A of the source/drain pattern 130 so as to constitute the first transistor T1. The gate pattern 422 disposed over the second channel 220 traverses the second section 130B of the source/drain pattern 130 as well as the branch pattern 140 in order to constitute the second transistor T2. Moreover, the second power line 442 disposed over the third channel 230 traverses the first extending section 152B of the sensing electrode connecting pattern 152 and the first power line 120 so as to constitute the third transistor T3.

Furthermore, by controlling the patterning process of the second patterned conductive layer 402 and the first insulation layer 302, the connecting section 152A and the sensing section 152C of the sensing electrode connecting pattern 152 are exposed. The gate connecting pattern 432 is near to the exposed connecting section 152A of the sensing electrode connecting pattern 152. Therefore, referring to the top view of FIG. 10A, the connecting section 152A of the sensing electrode connecting pattern 152 and the gate connecting pattern 432 compose two elements arranged side by side on the substrate 10.

Figure 11A:
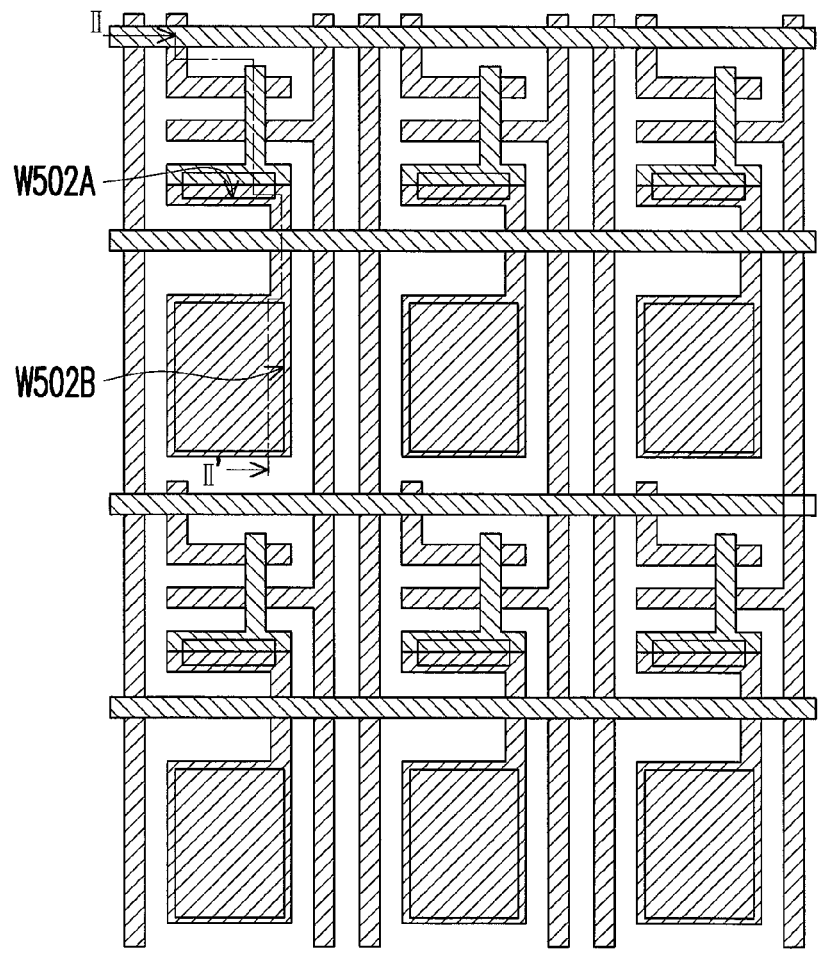
Figure 11B:
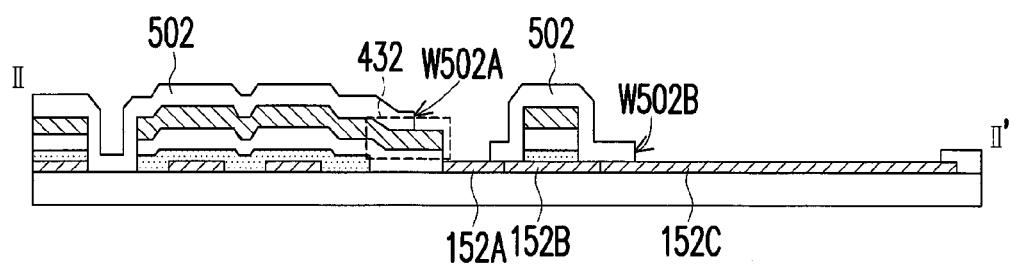

Thereafter, referring to the FIG. 11A and FIG. 11B, a second insulation layer 502 is formed over the second patterned conductive layer 402, wherein the second insulation layer 502 has a first connecting opening W502A and a second connecting opening W502B. The first connecting opening W502A exposes both the gate connecting pattern 432 and the connecting section 152A of the sensing electrode connecting pattern 152. The second connecting opening W502B exposes the sensing section 152C of the sensing electrode connecting pattern 152.

Figure 12A:
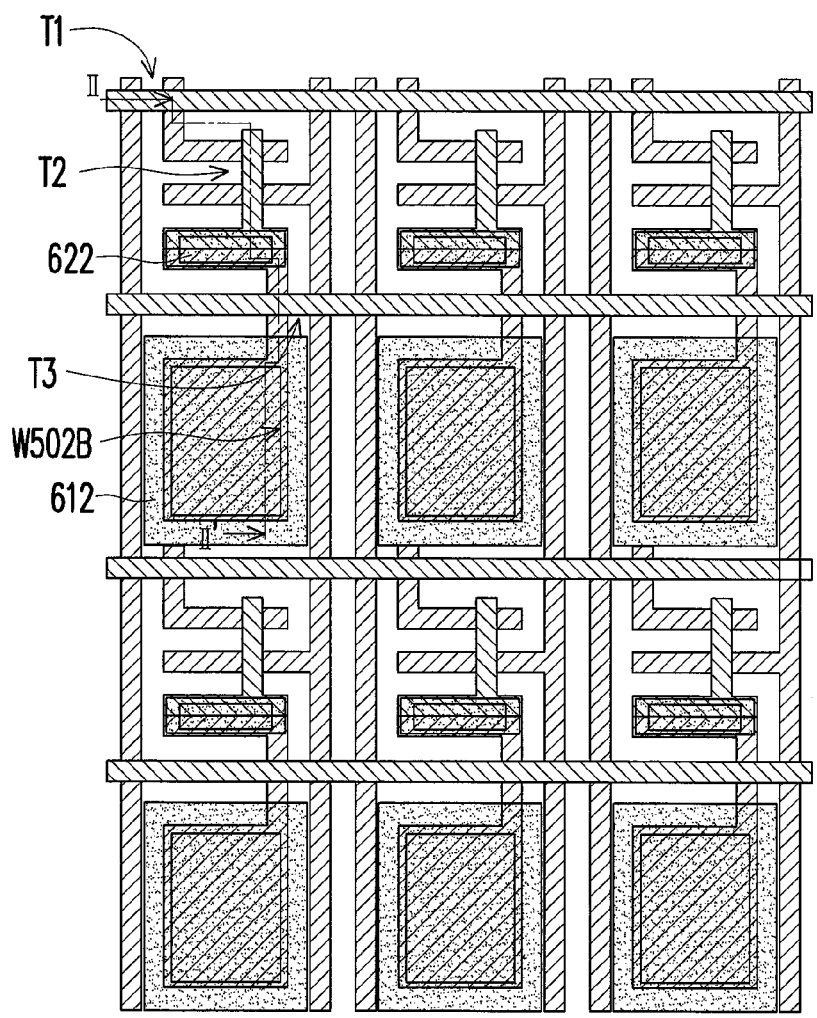
Figure 12B:
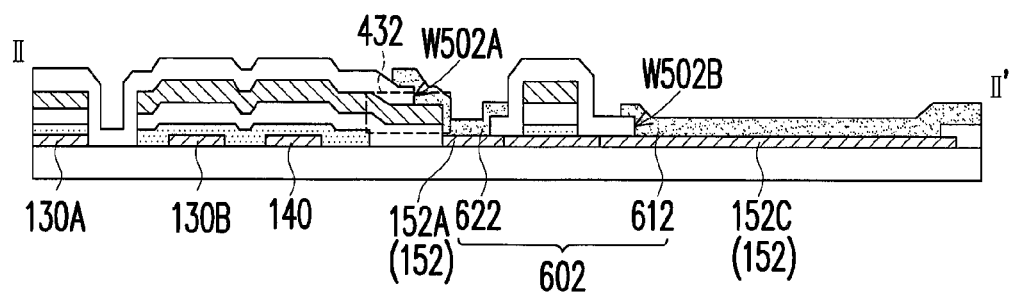

Afterwards, referring to the FIG. 12A and FIG. 12B, a third patterned conductive layer 602 for defining a sensing electrode 612 and a connecting electrode 622 are formed over the second insulation layer 502. In the present embodiment, the sensing electrode 612 is connected to the sensing section 152C of the sensing electrode pattern 152 through the second connecting opening W502B, and the connecting electrode 622 is connected to the connecting section 152A of the connecting electrode pattern 152 and the gate connecting pattern 432 through the first connecting opening W502A. Accordingly, the gate of the second transistor T2 can be connected to the source or the drain of the third transistor T3, and the source or the drain of the first transistor T1 can be connected to the source or the drain of the second transistor T2 by applying the design of the integral source/drain pattern 130 so as to compose a current detecting circuit. However, the disclosure is not limited by the present embodiment.

Figure 13A:
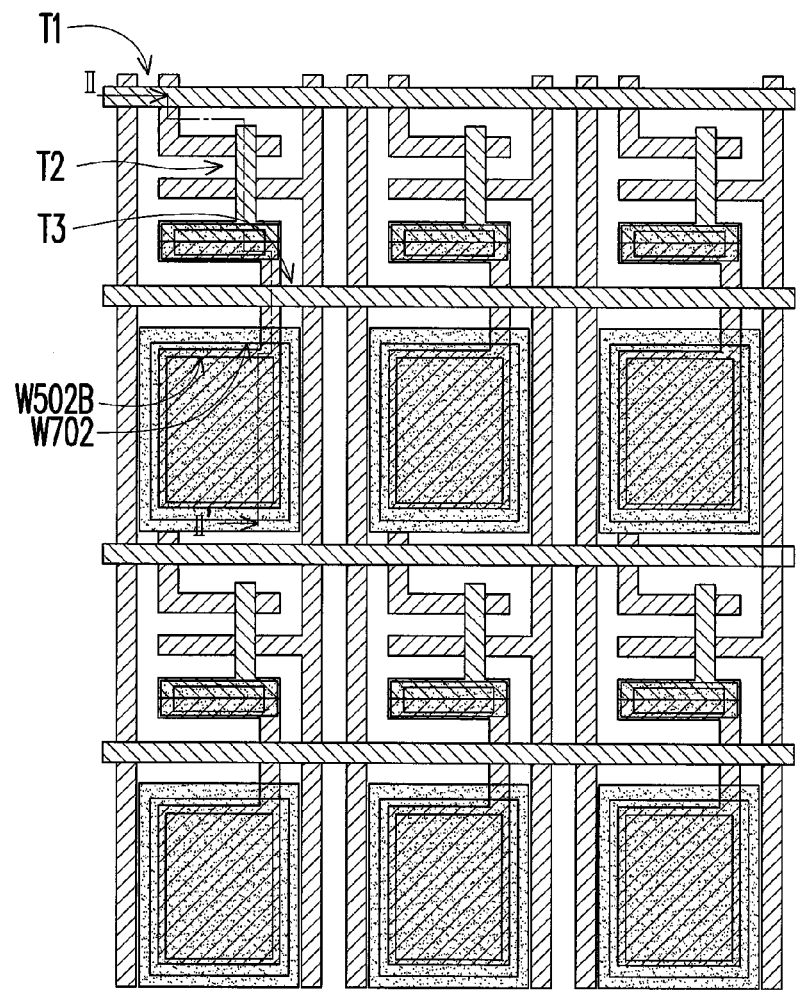
Figure 13B:
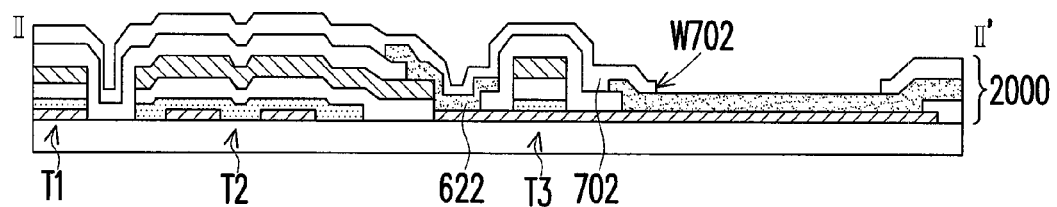

Furthermore, referring to the FIG. 13A and FIG. 13B, for protecting the first transistor T1, the second transistor T2, the third transistor T3 and the connecting electrode 622, a third insulation layer 702 is formed for covering the first transistor T1, the second transistor T2, the third transistor T3 and the connecting electrode 622 over the substrate 10 in the present embodiment. It should be noted that an opening W702 is disposed in the third insulation layer 702 for exposing the sensing electrode 612 in order to compose the sensor element array 2000. A detecting circuit of an active array sensing element can be accomplished because of the coupling of the first transistor T1, the second transistor T2 and the third transistor T3, wherein the first transistor T1 is served as a switch transistor of a sensing circuit unit, while the second transistor T2, the third transistor T3 and the sensing elements (e.g. the sensing electrode) are composed as an inverter circuit structure. However, the disclosure is not limited by the present embodiment.

Figure 14:
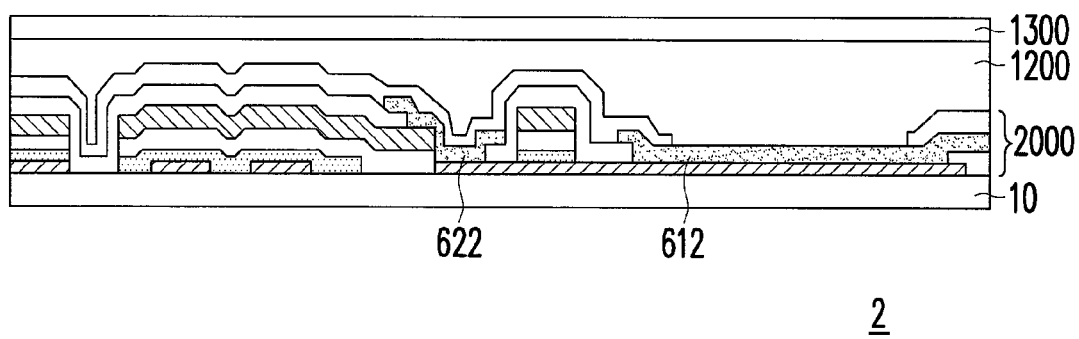
FIG. 14 is a cross-sectional view of a sensing panel according to the second embodiment of the disclosure.

FIG. 14 is a cross-sectional view of a sensing panel according to the second embodiment of the disclosure. Referring to the FIG. 14, the sensing panel 2 includes a sensor element array 2000 formed on the substrate 10, a sensing dielectric layer 1200, and an opposite electrode 1300, wherein the opposite electrode 1300 and the sensing electrode 612 of the sensor element array 2000 are disposed respectively at the opposite sides of the sensing dielectric layer 1200. Herein, the sensor element array 2000, for example, is fabricated by following the steps illustrated in the FIG. 8A-FIG. 13A and the FIG. 8B-FIG. 13B. Hence, the elements of the sensor element array 2000 can be referred to the previous paragraphs. Moreover, the material of the sensing dielectric layer 1200, for example, can be the material which has the electrical property changed according to the loading stress such as carbon paste. Therefore, when the user presses the sensing panel 2, the electrical property change of the sensing dielectric layer 1200 can be detected by the sensor element array 2000 in order to accomplish the sensing of the stress. At this moment, the sensing panel 2 is a resistance sensing panel, for example.

Figure 15A:
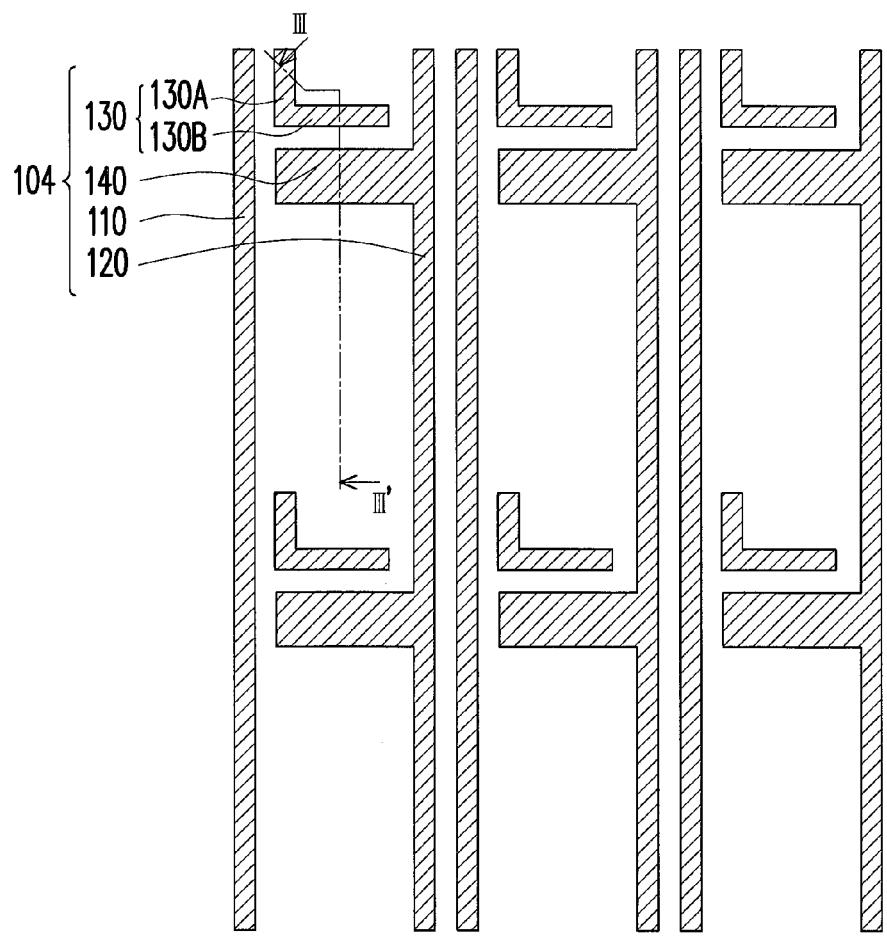
Figure 15B:
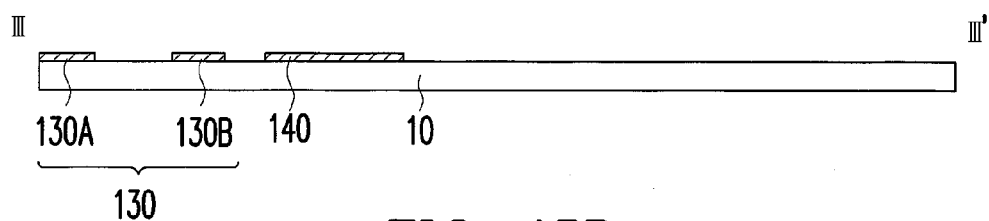

FIG. 15A, 16A through FIG. 20A are top views illustrating the flow of fabricating the sensor element array in the third embodiment of the disclosure, and FIG. 15B, 16B through FIG. 20B are schematic cross-sectional views taken along a line of FIG. 15A through FIG. 20A. Referring to FIG. 15A and FIG. 15B, a fabricating method of the present embodiment includes a process to form a first patterned conductive layer 104 on a substrate 10. The first patterned conductive layer 102 includes a sensing line 110, a first power line 120, a source/drain pattern 130 and a branch pattern 140. In the present embodiment, the allocation of the sensing line 110, the first power line 120, the source/drain pattern 130 and the branch pattern 140 is much like the allocation thereof in the first embodiment, so no detailed description is repeated. To be more specific, the first patterned conductive layer 104 in the present embodiment does not include the sensing electrode connecting pattern 150 depicted in the first embodiment.

Figure 16A:
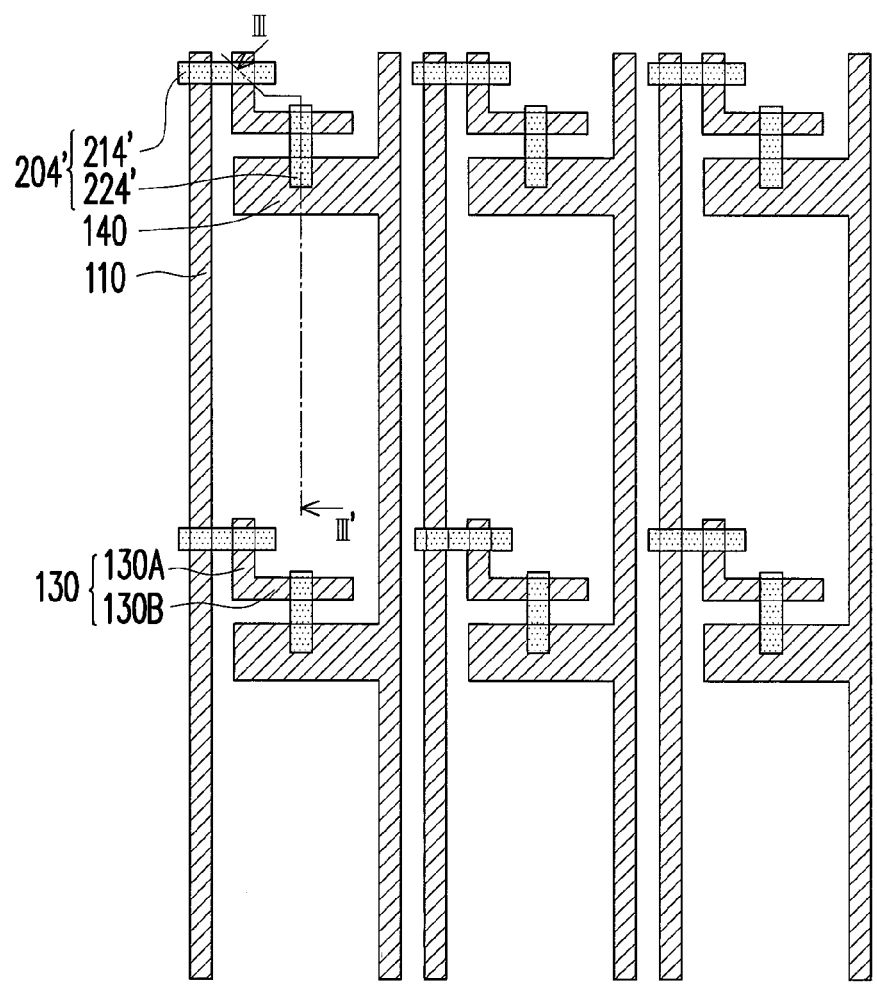
Figure 16B:
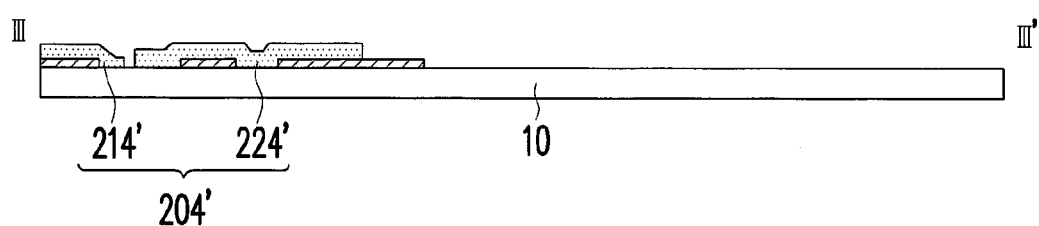

Referring next to FIG. 16A and FIG. 16B, a pre-patterned channel layer 204', including a first pre-patterned channel 214' and a second pre-patterned channel 224' is formed on the first patterned conductive layer 104. The first pre-patterned channel 214' connects the sensing line 110 with the first section 130A of the source/drain pattern 130, and the second pre-patterned channel 224' connects the branch pattern 140 with the second section 130B of the source/drain pattern 130.

Figure 17A:
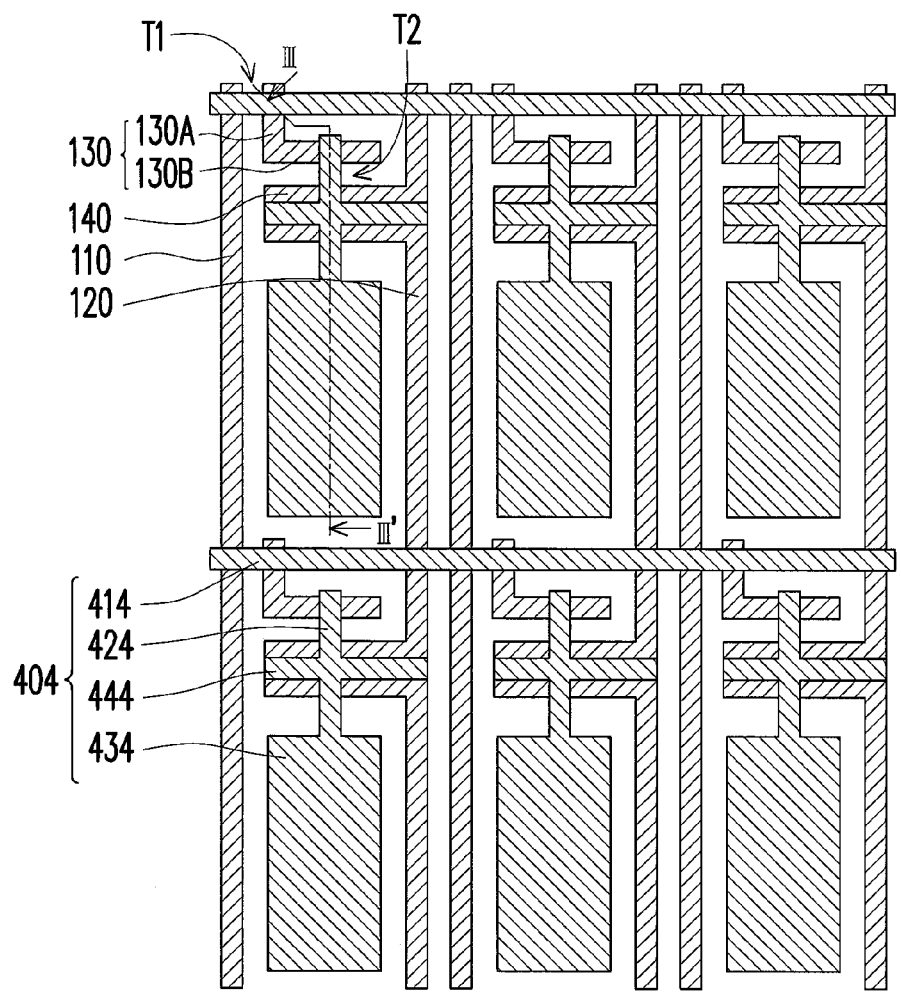
Figure 17B:
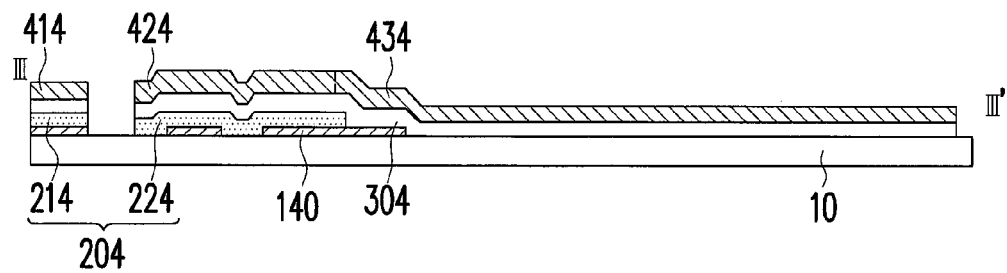

Next, referring to the FIG. 17A and FIG. 17B, an insulating material layer and a conductive material layer are sequentially formed over the substrate 10 and patterned to form a first insulation layer 304 and a second patterned conductive layer 404. Similar to the first embodiment, the method for patterning the insulating material layer and the conductive material layer includes first patterning the conductive material layer to the second patterned conductive layer 404, and second using the second patterned conductive layer 404 as a mask for patterning the first insulation layer 304. At this moment, margins of the first insulation layer 304 and the second patterned conductive layer 402 are substantially overlapped.

In addition, this step further removes the exposed part of the pre-patterned channel layer 204' by applying the second patterned conductive layer 404 as a mask in order to form the channel layer 204. Herein, the first pre-patterned channel 214' and the second pre-patterned channel 224' illustrated in the FIG. 16A and FIG. 16B are patterned respectively to be the first channel 214 and the second channel 224.

In the present embodiment, the second patterned conductive layer 404 includes a selecting line 414, a gate pattern 424, a gate connecting pattern 434 and a capacitor pattern 444. The selecting line 414 disposed over the first channel 214 traverses the sensing line 110 and the first section 130A of the source/drain pattern 130 so as to define the first transistor T1. The gate pattern 424 disposed over the second channel 224 traverses the second section 130B of the source/drain pattern 130 as well as the branch pattern 140 in order to define a second transistor T2. Moreover, the capacitor pattern 444 of the second patterned conductive layer 404 in the present embodiment is connected to the gate pattern 424 and stacked over the branch pattern 140 at the side away from the substrate 10. The first insulation layer 304 is sandwiched between the capacitor pattern 444 and the branch pattern 140 in order to provide a reference capacitance during the detection. However, the disclosure is not limited by the present embodiment. In other embodiments, the second patterned conductive layer 404 does not include the capacitor pattern 444.

Figure 18A:
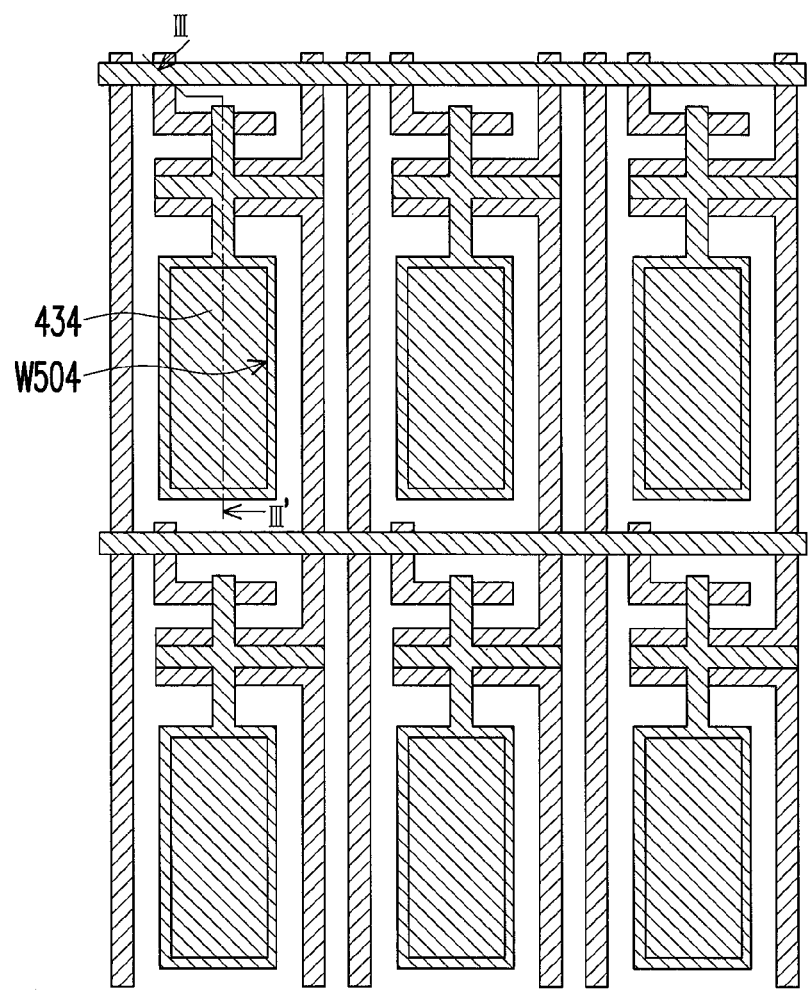
Figure 18B:
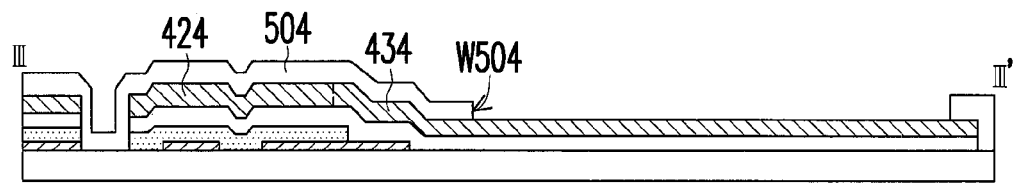

Thereafter, referring to the FIG. 18A and FIG. 18B, a second insulation layer 504, which includes a connecting opening W504 for exposing the gate connecting pattern 434, is formed on the second patterned conductive layer 404.

Figure 19A:
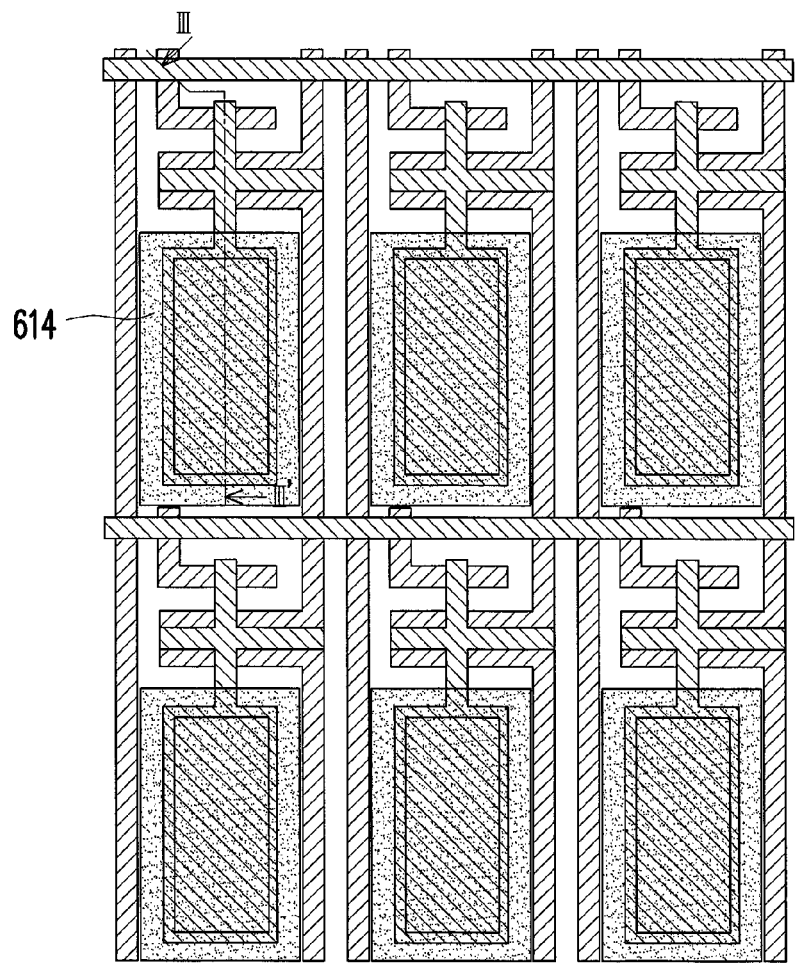
Figure 19B:
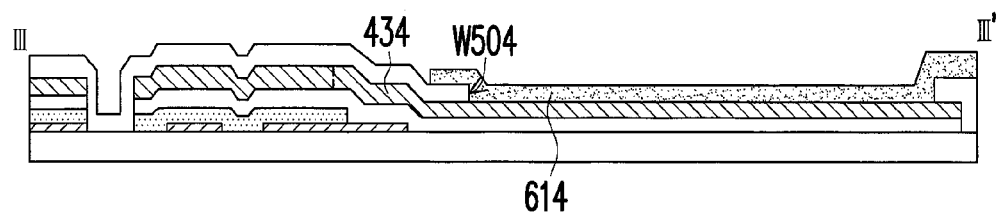

Afterwards, referring to the FIG. 19A and FIG. 19B, a third patterned conductive layer for defining the sensing electrode 614 is formed on the second insulation layer 504. In the present embodiment, the sensing electrode 614 is connected to the gate connecting pattern 434 through the connecting opening W504.

Figure 20A:
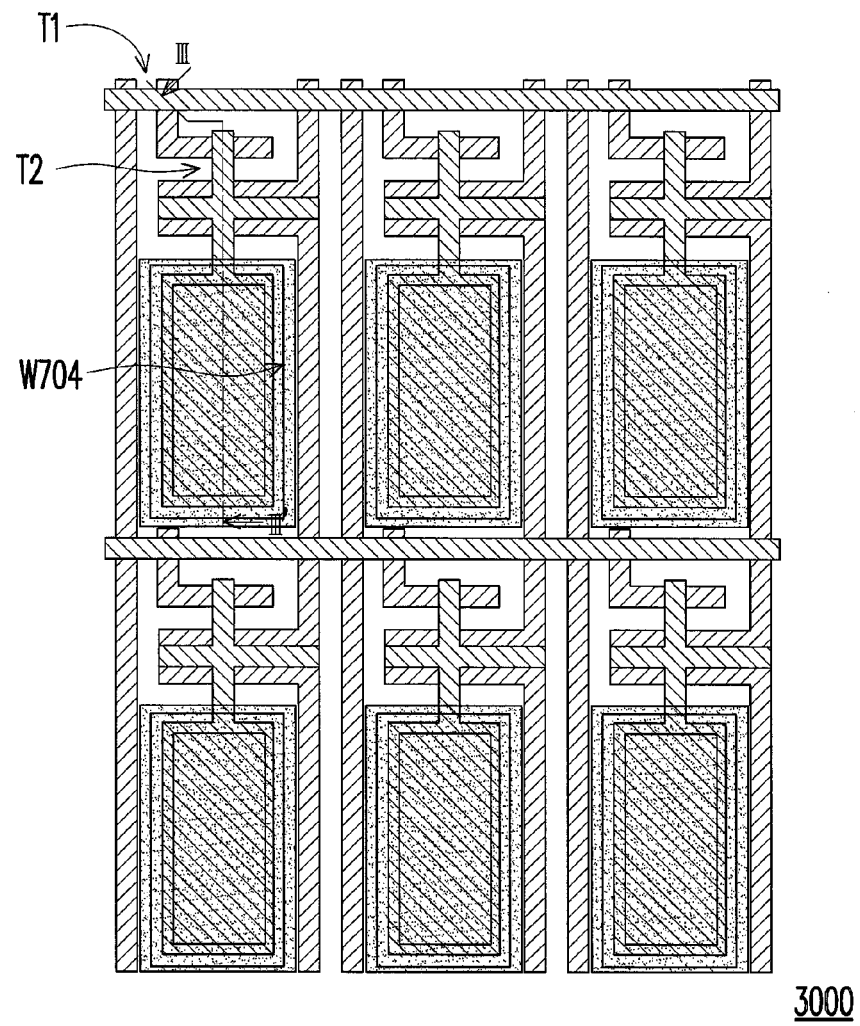
Figure 20B:
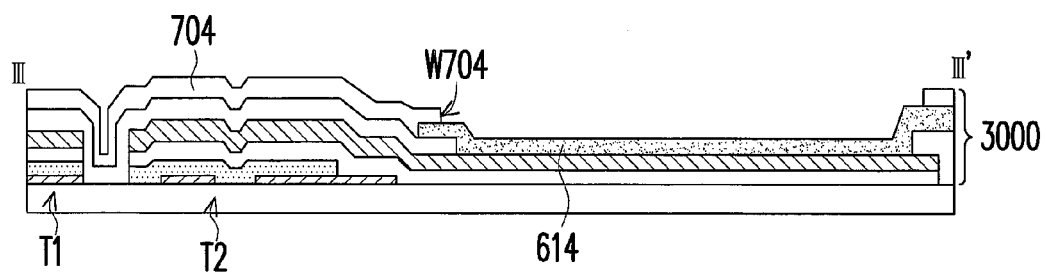

Furthermore, referring to the FIG. 20A and FIG. 20B, for protecting the first transistor T1 and the second transistor T2, a third insulation layer 704 is formed for covering the first transistor T1 and the second transistor T2 over the substrate 10 in the present embodiment. Also, an opening W704 is disposed with the third insulation layer 704 for exposing the sensing electrode 614 in order to compose the sensor element array 3000. A detecting circuit of an active array sensing element can be accomplished because of the coupling of the first transistor T1 and the second transistor T2, wherein the first transistor T1 served as a switch transistor of a sensing circuit unit, the second transistor T2 and the capacitive sensing elements are composed as a circuit structure capable of detecting the capacitance change of the sensing element. However, the disclosure is not limited by the present embodiment.

Figure 21:
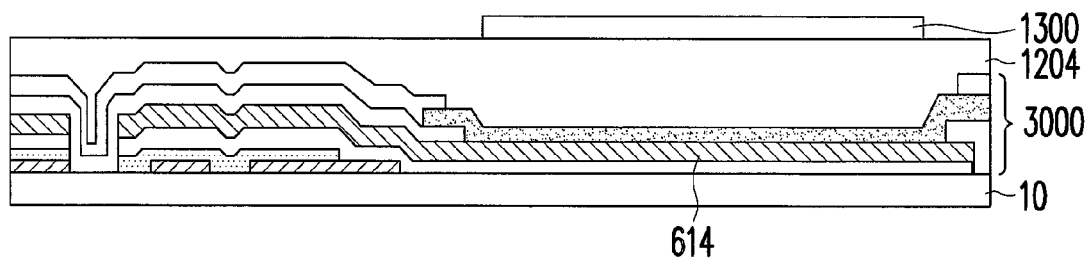
FIG. 21 is a cross-sectional view of a sensing panel according to the third embodiment of the disclosure.

FIG. 21 is a cross-sectional view of a sensing panel according to the third embodiment of the disclosure. Referring to the FIG. 21, the sensing panel 3 includes the sensor element array 3000 formed on the substrate 10, a sensing dielectric layer 1204, and an opposite electrode 1300, wherein the opposite electrode 1300 and the sensing electrode 614 of the sensor element array 3000 are disposed respectively at the opposite sides of the sensing dielectric layer 1204. Herein, the sensor element array 3000, for example, is fabricated by following the steps illustrated in the FIG. 15A-FIG. 20A and the FIG. 15B-FIG. 20B. Hence, the elements of the sensor element array 3000 can be referred to the previous paragraphs. Moreover, the opposite electrode 1300 is disposed corresponding to the sensing electrode 614 and the material of sensing dielectric layer 1204 can be the insulating material with piezo-electric characteristics, for example, the polyvinylidene fluoride (PVDF) thin film or polypropylene (PP) thin film. Therefore, when the user presses the sensing panel 3, the change of the capacitance between the opposite electrode 1300 and the sensing electrode 614 of the sensor element array 3000 can be detected by the sensor element array 3000 in order to accomplish the stress detection. In other words, the sensing panel 3 is a capacitive sensing panel.

Figure 22A:
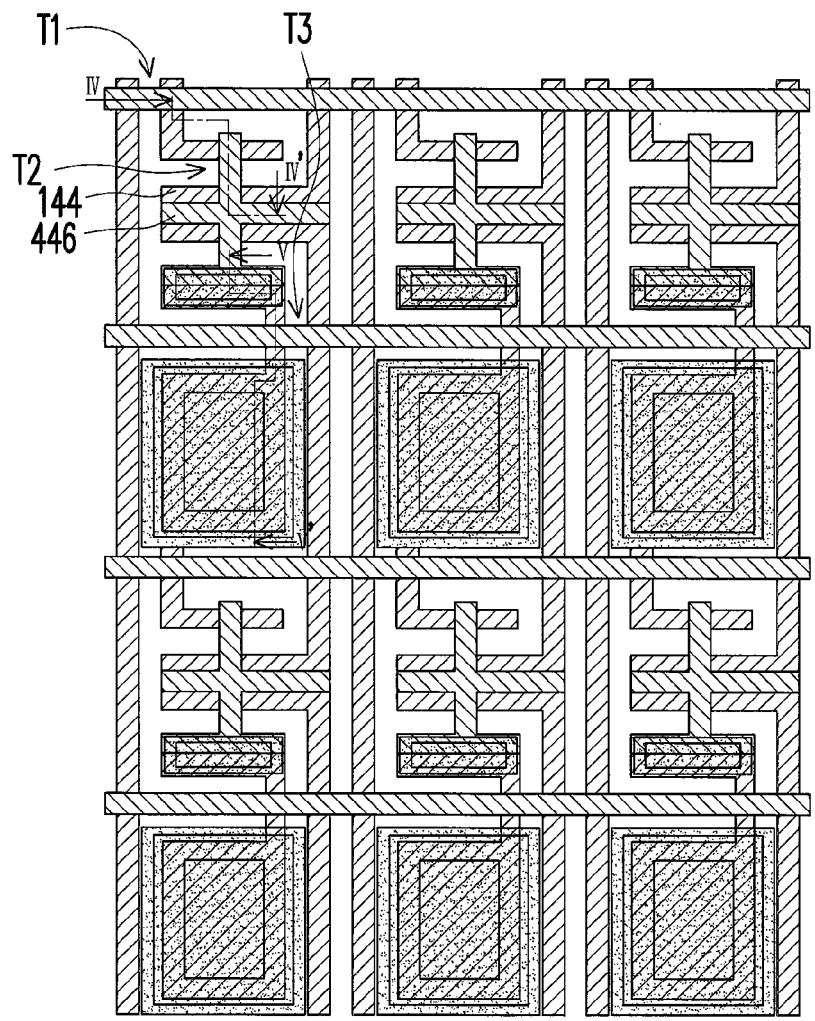
FIG. 22A is a top view of the sensor element array according to the fourth embodiment of the disclosure.
Figure 22B:
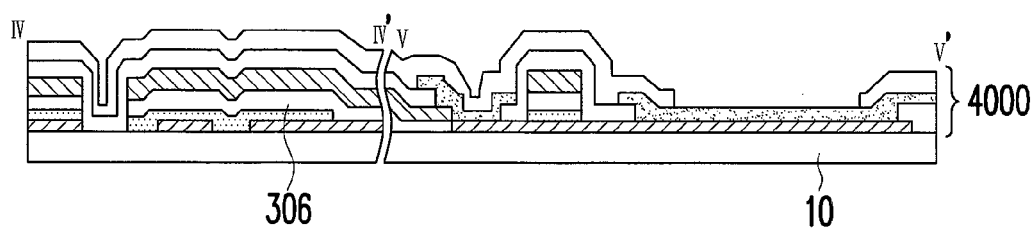
FIG. 22B is a schematic cross-sectional view taken along a line IV-IV' and a line V-V' of FIG. 22A.

FIG. 22A is a top view of the sensor element array according to the fourth embodiment of the disclosure, and FIG. 22B is a schematic cross-sectional view taken along line IV-IV' and line V-V' of FIG. 22A. Referring the FIG. 22A and the FIG. 22B, the sensor element array 4000 is substantially alike the sensor element array 2000 in the second embodiment, so the same elements in the two embodiments are shown in the same reference numbers. Also, the fabricating method of the sensor element array 4000 refers to the fabricating method of the sensor element array 2000. To be more specific, the difference between the present embodiment and the second embodiment is that the area of the branch pattern 144 in the present embodiment is larger than the area of the branch pattern 140 in the second embodiment and the second patterned conductive layer 406 of the sensor element array 4000 further includes a capacitor pattern 446. Besides, the first insulation layer 306 is sandwiched between the capacitor pattern 446 and the branch pattern 144 in order to provide a reference capacitance during the detection. In the present embodiment, a detecting circuit of an active array sensing element can be accomplished because of the coupling of the first transistor T1, the second transistor T2 and the third transistor T3. The first transistor T1 is served as a switch transistor of a sensing circuit unit, and the second transistor T2, the third transistor T3 and the capacitive sensing elements are composed as a circuit structure capable of detecting the capacitance change of the sensing element. However, the disclosure is not limited by the present embodiment.

Figure 23:
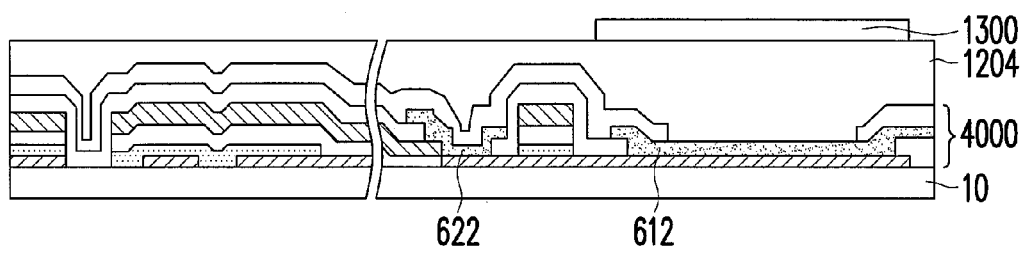
FIG. 23 is a cross-sectional view of a sensing panel according to the fourth embodiment of the disclosure.

FIG. 23 is a cross-sectional view of a sensing panel according to the fourth embodiment of the disclosure. Referring to the FIG. 23, the sensing panel 4 includes the sensor element array 4000 formed on the substrate 10, a sensing dielectric layer 1204, and an opposite electrode 1300, wherein the opposite electrode 1300 and the sensing electrode 612 of the sensor element array 4000 are disposed respectively at the opposite sides of the sensing dielectric layer 1204. Herein, the material of sensing dielectric layer 1204 can be the insulating material with piezo-electric characteristics, for example, the polyvinylidene fluoride (PVDF) thin film or polypropylene (PP) thin film. Therefore, when the user presses the sensing panel 4, the change of the capacitance between the opposite electrode 1300 and the sensing electrode 612 of the sensor element array 4000 can be detected by the sensor element array 4000 in order to accomplish the stress detection. In other words, the sensing panel 4 is a capacitance sensing panel.

In summary, the sensor element array and the related fabricating method in the present disclosure expose not only the gate connecting pattern composed by the second metal layer, but also the sensing electrode connecting pattern composed by the first metal layer through the connecting opening of the second insulation layer. Simultaneously, the gate connecting pattern is connected to the gate of one transistor, and the sensing electrode connecting pattern is connected to the source or drain of another transistor. Therefore, the third patterned metal layer is connected to the gate connecting pattern, the sensing electrode connecting pattern, or both in order to accomplish the fabrication of the sensing element by using the connecting opening in the first insulation layer.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A fabricating method of a sensor element array, comprising:
   forming a first patterned conductive layer on a substrate, the first patterned conductive layer comprising a sensing line, a first power line, a source/drain pattern, and a branch pattern, the sensing line, the first power line and the source/drain pattern being separated individually, and the branch pattern being connected to the first power line, wherein the source/drain pattern comprises a first section next to the sensing line and a second section next to the branch pattern;
   forming a channel layer on the first patterned conductive layer, the channel layer comprising a first channel connecting the first section with the sensing line and a second channel connecting the second section with the branch pattern;
   forming an insulating material layer and a conductive material layer sequentially over the substrate and patterning the insulating material layer and the conductive material layer to form a first insulation layer and a second patterned conductive layer, such that margins of the first insulation layer and the second patterned conductive layer are substantially overlapped, wherein the second patterned conductive layer includes a selecting line, a gate pattern, and a gate connecting pattern, the selecting line traverses the sensing line and the first section of the source/drain pattern and is disposed over the first channel, the gate pattern is disposed over the second channel, and the gate connecting pattern is connected to the gate pattern;
   forming a second insulation layer on the second patterned conductive layer, where the second insulation layer has a first connecting opening for exposing the gate connecting pattern; and
   forming a third patterned conductive layer on the second insulation layer, where the third patterned conductive layer comprises a sensing electrode electrically connected to the gate connecting pattern.

2. The fabricating method of the sensor element array according to the claim 1, wherein the sensing electrode is directly formed on the gate connecting pattern which is exposed by the first connecting opening.

3. The fabricating method of the sensor element array according to the claim 1, wherein the method of forming the second patterned conductive layer further comprises forming a capacitor pattern, where the capacitor pattern is connected to the gate pattern and stacked over a side of the branch pattern away from the substrate.

4. The fabricating method of the sensor element array according to the claim 1, wherein the method of patterning the insulating material layer and the conductive material layer further comprises:
   patterning the conductive material layer to form the second patterned conductive layer; and
   applying the second patterned conductive layer as a mask for patterning the insulating material layer to form the first insulation layer.

5. The fabricating method of the sensor element array according to the claim 1, wherein the method of forming the channel layer comprises:
   forming a pre-patterned channel layer over the substrate, wherein after forming the second patterned conductive layer and the first insulation layer, an exposed section of the pre-patterned channel layer is exposed; and
   applying the second patterned conductive layer as a mask to remove the exposed section in order to form the channel layer.

6. The fabricating method of the sensor element array according to the claim 1, wherein the method of forming the first patterned conductive layer further comprises forming a sensing electrode connecting pattern, where the sensing line, the first power line, the source/drain pattern and the sensing electrode connecting pattern are separated individually, the sensing electrode connecting pattern comprises a connecting section and a first extending section connected to the connecting section, the first extending section is near to the first power line and the method for forming the channel layer further comprises forming a third channel which connects the first extending section with the first power line.

7. The fabricating method of the sensor element array according to the claim 6, wherein the method of patterning the conductive material layer and the insulating material layer comprises exposing the sensing electrode connecting pattern by the second patterned conductive layer and the first insulation layer, and disposing the gate connecting pattern near to the exposed sensing electrode connecting pattern.

8. The fabricating method of the sensor element array according to the claim 7, wherein the method of forming the second insulation layer comprises exposing the gate connecting pattern and the sensing electrode connecting pattern simultaneously by the first connecting opening.

9. The fabricating method of the sensor element array according to the claim 8, wherein the method of forming the third patterned conductive layer comprises forming the sensing electrode in contact with the gate connecting pattern and the sensing electrode connecting pattern through the first connecting opening.

10. The fabricating method of the sensor element array according to the claim 6, wherein the method of forming the second patterned conductive layer further comprises forming the gate connecting pattern comprising a second extending section, where the second extending section traverses the first extending section and the first power line, and the second extending section is disposed over the third channel.

11. The fabricating method of the sensor element array according to the claim 6, wherein the method of forming the first patterned conductive layer further comprises forming the sensing electrode connecting pattern comprising a sensing section, where the first extending section connects the sensing section with the connecting section, and the method of forming the second insulation layer further comprises forming a second connecting opening in the second insulation layer for exposing the connecting section.

12. The fabricating method of the sensor element array according to the claim 11, wherein the method of forming the second patterned conductive layer further comprises disposing a second power line over the third channel, and the second power line traverses the first extending section and the first power line.

13. The fabricating method of the sensor element array according to the claim 11, wherein the method of forming the third patterned conductive layer further comprises connecting the sensing electrode with the sensing section of the sensing electrode connecting pattern through the second connecting opening and forming a connecting electrode connected to the connecting section of the sensing electrode connecting pattern and the gate connecting pattern through the first connecting opening.

14. The fabricating method of the sensor element array according to the claim 1, further comprising forming a sensing dielectric layer and an opposite electrode over the substrate, wherein the opposite electrode and the sensing electrode are disposed at the respective sides of the sensing dielectric layer.

15. The fabricating method of the sensor element array according to the claim 1, wherein the method of forming the first patterned conductive layer, the channel layer, the first insulation layer and the second patterned conductive layer comprises a roll-to-roll process.

16. A sensor element array disposed on a substrate, the sensor element array comprising:
a first patterned conductive layer, the first patterned conductive layer comprising a sensing line, a first power line, a source/drain pattern and a branch pattern, the sensing line, the first power line and the source/drain pattern being separated individually, and the branch pattern being connected to the first power line, wherein the source/drain pattern comprises a first section and a second section, the first section is next to the sensing line, and the second section is next to the branch pattern;

a channel layer, comprising a first channel and a second channel, where the first channel connects the first section and the sensing line, and the second channel connects the second section and the branch pattern;
a first insulation layer;
a second patterned conductive layer, margins of the first insulation layer and the second patterned conductive layer being substantially overlapped, wherein the second patterned conductive layer comprises a selecting line, a gate pattern and a gate connecting pattern, the selecting line is traversed the sensing line and the first section of the source/drain pattern and disposed over the first channel, the gate pattern is disposed over the second channel, and the gate connecting pattern is connected to the gate pattern;
a second insulation layer, having a first connecting opening for exposing the gate connecting pattern; and
a third patterned conductive layer, having a sensing electrode electrically connected to the gate connecting pattern.

17. The sensor element array according to the claim 16, wherein the sensing electrode is directly connected to the gate connecting pattern which is exposed by the first connecting opening.

18. The sensor element array according to the claim 16, wherein the second patterned conductive layer further comprises a capacitor pattern, and the capacitor pattern is connected to the gate pattern and stacked over the branch pattern at one side away from the substrate.

19. The sensor element array according to the claim 16, wherein the first patterned conductive layer further comprises a sensing electrode connecting pattern, the sensing line, the first power line, the source/drain pattern, and the sensing electrode connecting pattern are separated individually and the sensing electrode connecting pattern comprises a connecting section and a first extending section connected to the connecting section, where the first extending section is near to the first power line, and the channel layer further comprises a third channel which connects the first extending section with the first power line.

20. The sensor element array according to the claim 19, wherein the second patterned conductive layer and the first insulation layer expose the sensing electrode connecting pattern, and the gate connecting pattern is near to the exposed sensing electrode connecting pattern.

21. The sensor element array according to the claim 20, wherein the first connecting opening exposes the gate connecting pattern and the sensing electrode connecting pattern simultaneously.

22. The sensor element array according to the claim 21, wherein the sensing electrode is directly connected to the gate connecting pattern and the sensing electrode connecting pattern simultaneously through the first connecting opening.

23. The sensor element array according to the claim 19, wherein the gate connecting pattern includes a second extending section disposed over the third channel, and the second extending section traverses the first extending section and the first power line.

24. The sensor element array according to the claim 19, wherein the sensing electrode connecting pattern further comprises a sensing section, the first extending section connects the sensing section with the connecting section, and the second insulation layer further comprises a second connecting opening which exposes the connecting section.

25. The sensor element array according to the claim 24, wherein the second patterned conductive layer further comprises a second power line disposed over the third channel and the second power line traverses the first extending section and the first power line.

26. The sensor element array according to the claim 24, wherein the sensing electrode is connected to the sensing section of the sensing electrode connecting pattern through the second connecting opening, and the third patterned conductive layer further comprises a connecting electrode, where the connecting electrode is connected to the connecting section of the sensing electrode connecting pattern and the gate connecting pattern through the first connecting opening.

27. The sensor element array according to the claim 16, further comprising a sensing dielectric layer and an opposite electrode disposed on the third patterned conductive layer at one side away from the substrate, wherein the opposite electrode and the sensing electrode are disposed at the respective sides of the sensing dielectric layer.

28. The sensor element array according to the claim 16, wherein the substrate is a flexible substrate.

* * * * *